United States Patent
Villemoes

(10) Patent No.: US 8,255,212 B2
(45) Date of Patent: Aug. 28, 2012

(54) FILTER COMPRESSOR AND METHOD FOR MANUFACTURING COMPRESSED SUBBAND FILTER IMPULSE RESPONSES

(75) Inventor: Lars Villemoes, Jaerfaella (SE)

(73) Assignee: Dolby International AB, Amsterdam Zuid-Oost (NL)

( * ) Notice: Subject to any disclaimer, the term of this patent is extended or adjusted under 35 U.S.C. 154(b) by 629 days.

(21) Appl. No.: 12/305,931

(22) PCT Filed: Jul. 3, 2007

(86) PCT No.: PCT/EP2007/005887
§ 371 (c)(1),
(2), (4) Date: Oct. 2, 2009

(87) PCT Pub. No.: WO2008/003467
PCT Pub. Date: Jan. 10, 2008

(65) Prior Publication Data
US 2010/0017195 A1    Jan. 21, 2010

(30) Foreign Application Priority Data

Jul. 4, 2006   (SE) .................................. 0601462

(51) Int. Cl.
*G10L 19/02* (2006.01)
(52) U.S. Cl. ........................................ 704/229
(58) Field of Classification Search ........... 704/200–230
See application file for complete search history.

(56) References Cited

U.S. PATENT DOCUMENTS

| | | | |
|---|---|---|---|
| 6,029,126 A * | 2/2000 | Malvar ........................... | 704/204 |
| 7,328,162 B2 * | 2/2008 | Liljeryd et al. ............... | 704/503 |
| RE40,281 E * | 4/2008 | Tzannes et al. ............... | 704/205 |
| RE42,949 E * | 11/2011 | Tzannes et al. ............... | 375/260 |
| 2001/0000660 A1 * | 5/2001 | Kober et al. ................... | 341/6 |
| 2004/0131204 A1 | 7/2004 | Vinton | |

(Continued)

FOREIGN PATENT DOCUMENTS

EP    0653846 A1    5/1995
(Continued)

OTHER PUBLICATIONS

English Translation of Taiwanese Official Letter of Notification of Examination mailed May 5, 2010 in parallel Taiwanese patent application No. 096124214, 5 pages.

*Primary Examiner* — Abul Azad
(74) *Attorney, Agent, or Firm* — Michael A. Glenn; Glenn Patent Group

(57) ABSTRACT

A filter compressor for generating compressed subband filter impulse responses from input subband filter impulse responses corresponding to subbands, which include filter impulse response values at filter taps, includes a processor for examining the filter impulse response values from at least two input subband filter input responses to find filter impulse response values having higher values and at least one filter impulse response value having a value being lower than the higher values, and a filter impulse response constructor for constructing the compressed subband filter impulse responses using the filter impulse response values having the higher values, wherein the compressed subband filter impulse responses do not include filter impulse response values corresponding to filter taps of the at least one filter impulse response value having the lower value or include zero-valued values corresponding to filter taps of the at least one filter impulse response value having the lower value.

57 Claims, 9 Drawing Sheets

U.S. PATENT DOCUMENTS

2007/0291951 A1 * 12/2007 Faller .......................... 381/22

FOREIGN PATENT DOCUMENTS

| | | |
|---|---|---|
| EP | 1047047 A2 | 10/2000 |
| JP | H11-503882 | 3/1999 |
| JP | 2000-507762 | 6/2000 |
| JP | 2000-338998 | 12/2000 |
| JP | 2002-033667 | 1/2002 |
| JP | 2006-512617 | 4/2006 |
| TW | 401659 B | 8/2000 |
| TW | 465196 B | 11/2001 |
| WO | WO95/31881 | 11/1995 |
| WO | WO97/37514 | 10/1997 |
| WO | WO2004/061823 | 7/2004 |
| WO | WO2005/043511 | 5/2005 |

* cited by examiner

FILTER COMPRESSOR AND METHOD FOR MANUFACTURING COMPRESSED SUBBAND FILTER IMPULSE RESPONSES

CROSS-REFERENCE TO RELATED APPLICATIONS

This application is a U.S. National Phase Entry of PCT/EP2007/005887 filed 3 Jul. 2007, which claims priority to Swedish Patent Application No. 0601462-5 filed 4 Jul. 2006 and U.S. Patent Application No. 60/806,607 filed 5 Jul. 2006.

TECHNICAL FIELD

The present invention relates to a filter compressor in the subband domain which is sometimes also referred to as the QMF domain (QMF=Quadrature Mirror Filterbank), which can for instance be employed in the field of audio applications such as filtering of head related transfer functions (HRTF) for a multi-channel sound experience over headphones.

BACKGROUND OF THE INVENTION

Recent development in filter conversion techniques has enabled a very efficient QMF representation of a time-domain filter. In general any FIR filter (FIR=Finite Impulse Response) in the time-domain can be converted into a set of complex filters each corresponding to a specific subband in the QMF. Hence, the filtering can take place in the complex QMF domain, similarly to how filtering can be performed using FFTs (FFT=Fast Fourier Transformation). Even so, the computational complexity of the QMF domain representation and implementation of the filtering can be substantial, for instance in the case of filters having a long impulse response in the time-domain.

Furthermore, recent development in audio coding has made available the ability to recreate a multi-channel representation of an audio signal based on a stereo (or mono) signal and corresponding control data. These methods differ substantially from older matrix based solution such as Dolby Prologic®, since additional control data is transmitted to control the re-creation, also referred to as up-mix, of the surround channels based on the transmitted mono or stereo channels.

Hence, such a parametric multi-channel audio decoder, e.g. MPEG Surround, reconstructs N channels based on M transmitted channels, with N and M are possible integers, wherein N>M, and the additional control data. The additional control data represents a significant lower data rate than transmitting all the N channels, making the coding very efficient while at the same time ensuring compatibility with both M-channel devices and N-channel devices.

These parametric surround coding methods usually comprise a parameterization of the surround signal based on IID (Inter channel Intensity Difference) and ICC (Inter Channel Coherence). These parameters describe power ratios and correlation between channel pairs in the up-mix process. Further parameters also used in conventional approaches comprise prediction parameters used to predict intermediate or output channels during the up-mix procedure.

Other developments in audio coding have provided means to obtain a multi-channel signal impression over stereo headphones. This is commonly done by downmixing a multi-channel signal to stereo using the original multi-channel signal and the so-called HRTF (Head Related Transfer Functions) filters. It has been shown in conventional approaches that the parametric multi-channel audio decoder can be combined with a binaural downmix algorithm making it possible to render a multi-channel signal over headphones without the need for first re-creating the multi-channel signal from the transmitted downmix signal, and subsequently downmixing it again by means of the HRTF filters. This is accomplished by combining the HRTF filters into four filters as a function of the parametric multi-channel representation. As a consequence, the four filters describe as a function of the parametric multi-channel representation how the stereo signal (two channels) used as an input for the multi-channel representation will be combined or mixed to achieve the resulting binaural or stereo output signals (two channels). So each of the four filters relate to one of the two input signals with respect to the two output signals. However, the HRTF filters can be quite long in order to nicely model room characteristics, and therefore the computational complexity of filtering the four HRTF filters in the QMF domain can become significant.

SUMMARY

According to an embodiment, a filter compressor for generating compressed subband filter impulse responses from input subband filter impulse responses corresponding to subbands, which have filter impulse response values at filter taps, may have: a processor for examining the filter impulse response values from at least two input subband filter impulse responses to find filter impulse response values having higher values, and at least one filter impulse response value having a value being lower than the higher values; and a filter impulse response constructor for constructing the compressed subband filter impulse responses using the filter impulse response values having the higher values, wherein the compressed subband filter impulse responses do not include filter impulse response values corresponding to filter taps of the at least one filter impulse response value having the lower value; or have zero-valued filter impulse response values corresponding to filter taps of the at least one filter impulse response value having the lower value.

According to another embodiment, a method for manufacturing compressed subband filter impulse responses from input subband filter impulse responses corresponding to the subbands, which have filter impulse response values at filter taps, may have the steps of: examining the filter impulse response values from at least two input subband filter impulse responses to find filter impulse response values having higher values and at least one filter impulse response value having a value being lower than the higher values; and constructing the compressed subband filter impulse responses using the filter impulse response values having the higher values, wherein the compressed subband filter impulse responses do not include filter impulse response values corresponding to filter taps of the at least one filter impulse response value having the lower value; or have zero-valued filter impulse response values corresponding to filter taps of the at least one filter impulse response value having the lower value.

Another embodiment may have a computer program for performing, when running on a processor, a method for manufacturing compressed subband filter impulse responses from input subband filter impulse responses corresponding to the subbands, which have filter impulse response values at filter taps, which method may have the steps of: examining the filter impulse response values from at least two input subband filter impulse responses to find filter impulse response values having higher values and at least one filter impulse response value having a value being lower than the higher values; and constructing the compressed subband filter impulse responses using the filter impulse response values having the higher values, wherein the compressed subband filter impulse responses do not include filter impulse response values corresponding to filter taps of the at least one filter impulse response value having the lower value; or have zero-valued filter impulse response values corresponding to filter taps of the at least one filter impulse response value having the lower value.

Another embodiment may have a computer-readable storage medium which may have stored thereon a plurality of sets of subband filter impulse responses, each set of subband filter impulse responses together approximating a time-domain head related transfer function-related filter, wherein a filter impulse response of each of the time-domain head related transfer function-related filters is larger than the sum of the lengths of the subband filter impulse responses of the respective set of subband filter impulse responses, or wherein a filter impulse response of each of the time-domain head related transfer function-related filters is larger than the sum of the lengths of the complex-valued filter impulse response values of the subband filter impulse responses of the respective set of subband filter impulse responses, when the filter impulse response values are complex-valued.

According to an embodiment of the present invention, a filter compressor for generating compressed subband filter impulse responses from input subband filter impulse responses corresponding to subbands, which comprise filter impulse response values at filter taps, comprises a processor for examining the filter impulse response values from at least two input subband filter impulse responses to find filter impulse response values having higher values, and at least one filter impulse response value having a value being lower than the higher values, and a filter impulse response constructor for constructing the compressed subband filter impulse responses using the filter impulse response values having the higher values, wherein the compressed subband filter impulse responses do no include filter impulse response values corresponding to filter taps of the at least one filter impulse response value having the lower value or zero-valued values corresponding to filter taps of the at least one filter impulse response value having the lower value.

A further embodiment of the present invention relates to a method for manufacturing compressed subband impulse responses from input subband filter responses corresponding to subbands, which comprise filter impulse response values at filter taps comprising examining the filter impulse response values from at least two input subband filter impulse responses to find filter impulse response values having higher values, and at least one filter impulse response value having a value being lower than the higher values, and constructing compressed subband filter impulse responses using the filter impulse response values having the higher values, wherein the compressed subband filter impulse responses do not include filter impulse response values corresponding to filter taps of the at least one filter impulse response value having the lower value or zero-valued values corresponding to filter taps of the at least one filter impulse response value having the lower value.

An embodiment of a computer-readable storage medium comprises stored thereon a plurality of sets of subband filter impulse responses, each set of subband filter impulse responses together approximating a time-domain head-related transfer function related filter, wherein a filter impulse response of the time-domain head-related transfer function-related filter is larger than the sum of the lengths of the subband filter impulse responses of the respective set of subband filter impulse responses, or wherein a filter impulse response of the time-domain head-related transfer function-related filter is larger than the sum of the lengths of the complex-valued filter impulse response values of the subband filter impulse responses of the respective set of subband filter impulse responses, when the filter impulse response values are complex-valued.

Some embodiments of the present invention can become favorable when it comes to balancing computational efficiency on the one hand and quality on the other hand. Embodiments offer both, a significant reduction of the computational complexity and an excellent approximation of a filter represented by the input subband filter impulse responses. The examination (eventually comprising selecting or determining) and constructing of the compressed subband filter impulse responses using the selected (or determined) filter impulse response values may achieve both, the reduction of the computational complexity and the excellent approximation in some embodiments and/or applications, which may lead to an (almost) audibly indistinguishable listening experience. In some embodiments this is achieved by finding, selecting or determining filter impulse response values of input filter impulse responses having higher values, while at least one filter impulse response value is not selected or determined, which has a value being lower than the higher values. Using the selected or determined filter impulse response values or the filter impulse response values having higher the higher values, a compressed filter impulse response having compressed filter impulse response values is constructed or manufactured. Depending on the implementation, the not selected or not determined filter impulse response value or the filter impulse response value having a value lower than the higher values is set to zero or disregarded. In other words, the filter impulse response values may comprise a pattern of disregarded, set to zero or otherwise modified filter impulse response values.

Furthermore, some embodiments may offer a wide range of achievable reductions of the computational complexity by influencing the selecting of filter impulse response values on the basis of which the compressed subband filter impulse responses are constructed. As a consequence, some embodiments of the present invention offer an enormous flexibility in balancing the achievable adaptation of computational complexity on the one hand and the quality of the approximation on the other hand.

Some embodiments of the present invention can therefore be especially applied in the field of audio or other applications involving filters having a comparably long (finite) impulse response in the time-domain. As will be explained later, by converting the filter or filter element from the time-domain into the (complex) subband domain, the computations can be carried out in parallel as the impulse responses of the individual subband filters are significantly shorter compared to the impulse response of the filter in the time-domain.

However, the overall computational complexity cannot only be reduced by a pure transition from the time-domain into the (complex) subband domain alone. For instance, for filters having a comparably long impulse response, such as HRTF filters, even the individual subband filters usually have a long finite impulse response, which is very roughly speaking of the order of the finite impulse response of the corresponding filter in the time-domain divided by the number of individual subbands. Hence, depending on the computational power available in certain applications, the overall computational complexity or even the computational complexity relating to an individual subband filter can be substantial.

Additionally, or alternatively, also a level-based determination of the filter impulse response can be implemented in an embodiment of a filter compressor. In such a case, the filter compressor may be adapted such that at least one filter impulse response value may be set to zero or be disregarded, when the value (e.g. the absolute value) of the filter impulse response is below a threshold. In some fields of applications, one or more filter impulse response values may be close to an aliasing level of a filterbank corresponding to the input subband filter impulse response. When the value of the filter impulse response value is close to the aliasing level of such a corresponding filterbank, certain taps are allowed to be set to zero so that the corresponding filter coefficients or filter impulse response values may safely be set to zero. As a consequence, an implementation of a filter based on such a compressed filter impulse response is not required to perform a multiply-add for zero-valued coefficients or impulse response values.

In this context, an aliasing level of a filterbank is an inherent characteristic of many filterbanks. Such an aliasing level of a filterbank may result from a purely processing of the signal, for instance in the framework of a SBR application. As each filter tap or filter impulse response value contributes to the out coming signal, the smaller (e.g. an absolute value of) the tabs are, the smaller the result or the contribution of the respective taps will be in terms of the output of the filterbank. Hence, it may happen that small taps have such a small contribution to the output of the filterbank that their contribution will be in the range or of the order of the aliasing level of the respective filterbank. In this case an additional distortion introduced by setting the corresponding taps to zero can in many cases be tolerated, as it will not introduce additional audible distortions. In many cases, typical ranges of the aliasing level are in the range of and below −30 dB, −40 dB, −50 dB, −60 dB and −70 dB compared to a peak signal.

For instance, in the case of HRTF filters, after converting the time-domain HRTF filters to a complex QMF representation, some of the time-frequency tiles in the complex QMF representation can have low absolute values (at the aliasing level of the MPEG surround filterbank). These entries in the complex QMF representation of the HRTF filters may then be set to zero. This enables a complexity reduction for implementing long HRTF filters with room-response included in the complex QMF representation. Therefore, in order to achieve a binauralization at a reduced complexity, while maintaining realistic room effects, a filter converter may be followed by a filter reduction process in the form of an embodiment of a filter compressor. The filter reduction step aims at simplifying the HRTF filters such that the subbands HRTF filters comprise at least a few or even a substantial number of zeros. Since fewer coefficients are active, a significant reduction in computational complexity can thereby be achieved.

Hence, an embodiment of a filter compressor, a set of manufactured compressed subband filter impulse responses provided by an embodiment of the method for manufacturing same and an embodiment of a computer-readable storage medium comprising a plurality of compressed subband filter impulse responses may be capable of significantly reducing the individual computational complexity for each subband filter as well as the overall computational complexity concerning all subband filters.

BRIEF DESCRIPTION OF THE DRAWINGS

Embodiments of the present invention will be detailed subsequently referring to the appended drawings, in which.

DETAILED DESCRIPTION OF THE INVENTION

The below-described embodiments are merely illustrative for the principles of the present invention for an efficient filter representation. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Before describing the embodiment of the present invention in more detail, additional components and applications of embodiments, it should be noted that objects, structures and components with the same or similar functional properties are denoted with the same reference signs. Unless explicitly noted otherwise, the description with respect to objects, structures and components with similar or equal functional properties and features can be exchanged with respect to each other. Furthermore, in the following summarizing reference signs for objects, structures and components, which are identical or similar in one embodiment, or appear in different structures shown in one of the figures, will be used, unless properties or features of the specific object, structure of component are discussed. Using summarizing reference signs thereby enable a more compact and clearer description of embodiments of the present invention and underline the possibility of an interchange of features and descriptions between different embodiments.

Moreover, it should be noted that in the following embodiments shown in the Figures equally describe the corresponding embodiments of the methods. The embodiments shown in the Figures therefore do not only illustrate the corresponding embodiments of, for instance, a filter compressor, but also represent a flowchart of the corresponding embodiments of the corresponding methods. As outlined below, such an embodiment of a method can be implemented in hardware or in software.

Figure 1:
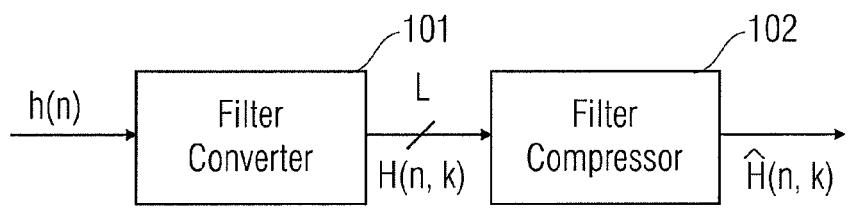
FIG. 1 illustrates an interplay of a filter converter and an embodiment of a compressor according to the present invention.

In FIG. 1, one embodiment of the present invention along with a possible application is outlined. To be more precise, FIG. 1 shows a filter converter 101 being connected to an embodiment of a filter compressor 102. The filter converter 101 will be described in more detail later on. The embodiments of a filter converter 101 is provided with an input signal comprising information concerning a finite impulse response h(n) of a filter or a filter element in the time-domain. The index n is in this context an integer indicating different values or samples of the finite impulse response (FIR), wherein h(n) is a real-value number.

The finite impulse response of a time-domain filter h(n) is a response of a filter or filter element in the time-domain upon an excitation in the form of a single impulse having a defined amplitude. In principle, the complete behavior of the filter element in the time-domain is comprised in the finite impulse response of the filter. In the case of a digital system, the impulse response of the filter can be determined or measured by applying an input signal having at a single instance in time a value which is different from zero. This value can, for instance be equal to 1.

Figure 10:
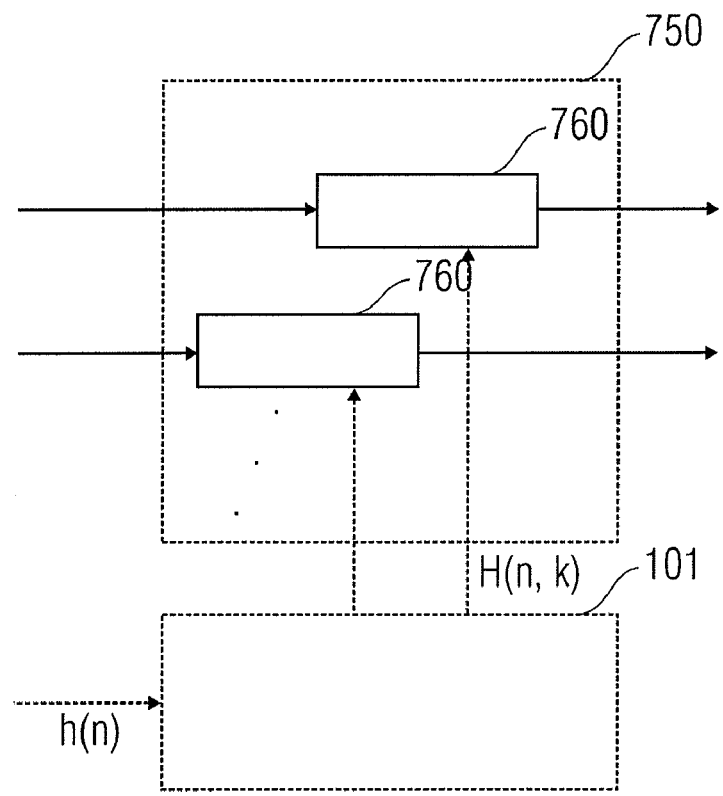
FIG. 10 illustrates a possible solution of an adaptable subband filterbank.

The filter converter 101 is capable of providing a set of finite impulse responses H(n,k) which can be used in the framework of an adaptable filter, as will be outlined in the context of FIG. 10. It should be noted that in the case of a complex filter converter based upon a complex analysis filterbank, the finite impulse responses H(n,k) comprises complex-valued numbers, wherein n once again indicates the different samples and k=0, . . . , (L−1) indicates the corresponding subband to which the finite impulse response of the subband filter corresponds. Both, l and k are integers. Moreover, the number of subbands L is also a positive integer. In the case of digital systems, the number L of the subbands provided by the filter converter 101 and later on used for filtering digital audio input signals, is often a power of 2, e.g. 16, 32, 64, 128, 256, 512. In the following examples, the number of subbands is chosen to be L=64. However, as outlined before, in principle every positive integer L as a number of subbands in applications, components and embodiments of a filter compressor can be employed.

As explained, the time-domain filter h(n) is input into the filter converter 101 that produces a complex QMF or subband representation of the filter H(n,k). In this particular example where a L=64 subband QMF is used, the complex QMF representation of the filter, for a time-domain filter of length K having a length of the finite impulse response of a multiplicity of L=64, will be represented by L=64 complex filters of length K/64+2.

The filter H(n,k) is subsequently input to the filter compressor 102, according to the present invention, that outputs Ĥ(n,k) as a compressed subband filter impulse response. The embodiment of the filter compressor 102 outputs a filter Ĥ(n, k) that has a higher number of zero-valued coefficients than the original filter H(n,k) has, and therefore allows for lower computational complexity.

Depending on the embodiment and the application, the filter converter 101 and the filter compressor 102 are coupled to each other via L connections, over each of which a filter impulse response corresponding to the different subbands (index k=0, . . . , L−1 or k=1, . . . , L) is transmitted. This option is indicated in FIG. 1 by the slash (/) crossing the connection of the filter converter 101 and the filter compressor 102. However, the two components may also be coupled to each other by a lesser number of connections or even by only a single connection, over which the corresponding signals or information are transmitted. For the sake of simplicity in the figures and the embodiments shown a possible parallel connection of elements comprising an individual connection for each subband is shown where appropriate. However, whenever signals or information concerning subbands are transmitted, for instance as illustrated by the variables indicating same (e.g. H(n,k)), any connection can be implemented.

As will be explained in more detail later on the embodiment of filter compressor 102 also outputs a set of or a plurality of filter impulse responses for a respective number of subband filters comprised, for instance, in a subband filterbank. Both, the input subband filter impulse responses H(n,k) and the compressed subband filter impulse responses Ĥ(n,k) are both complex-valued numbers arranged in a two-dimensional matrix being labeled by the time-related n and the subband-related k as explained previously.

However, more details concerning different embodiments of a filter compressor 102 will be outlined later on. Moreover, the relation between the compressed subband filter impulse responses Ĥ(n,k) and the input subband filter responses H(n,k) will also be explained for different embodiments of a filter compressor 102 later on. It is important to note that in principle, the two respective sets of pluralities of filter impulse responses H(n,k) and Ĥ(n,k) can differ in more ways than only with respect the number of zero-valued coefficients, as will be outlined shortly.

Figure 2:
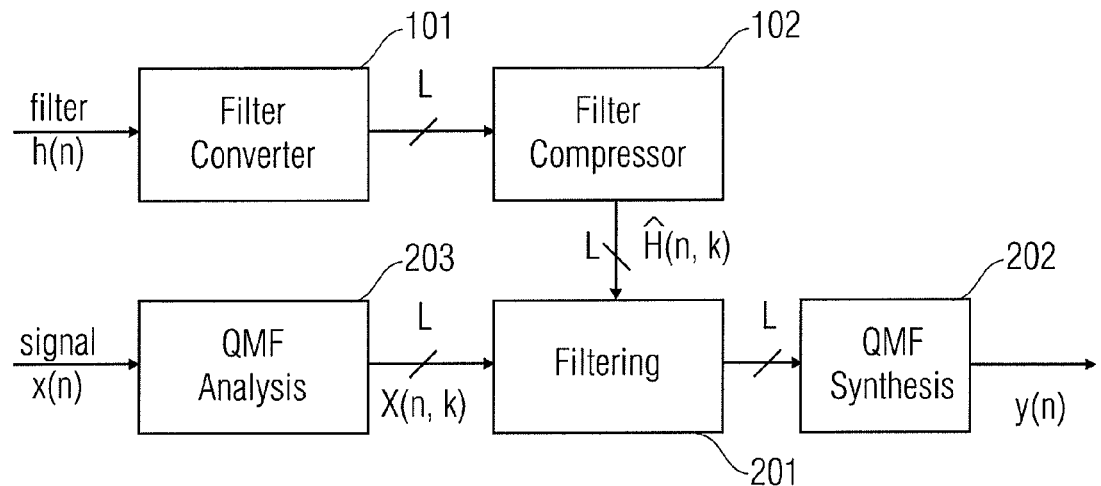
FIG. 2 illustrates a use-case scenario for the present invention.

In FIG. 2, a general use-case scenario for the present invention is outlined. Here the time-domain filter h(n), is again input to the filter converter 101 that produces a complex QMF representation of the filter H(n,k), the complex QMF filter H(n,k) is input to an embodiment of a filter compressor 102, that outputs the reduced or compressed complex QMF filter Ĥ(n,k), as previously explained.

Apart from a filter converter 101, which is provided with the real-valued impulse response of a filter in the time-domain h(n) and the embodiment of a filter compressor 102, which were both explained in the context of FIG. 1, the use-case scenario shown in FIG. 2 further comprises a QMF analysis filterbank 203, which is also referred to as a complex analysis filterbank. The QMF analysis filterbank 203 is provided with an input signal x(n), which can for instance be a digital audio signal. The QMF analysis filter domain 203 provides at an output a complex QMF representation X(n,k) of the input signal x(n). As explained in the context of FIG. 1 the integers n and k relate to the sample or time index and the subband index, respectively. A possible solution for a QMF analysis filterbank 203 will be explained in more detail in the context of FIG. 9.

The complex QMF representation X(n,k) of the input signal x(n) is subsequently provided to a filtering stage 201 operating in the subband domain. The filtering stage or subband filter 201 is an adjustable subband filterbank, which comprises a plurality of L intermediate filters which are coupled to the output of the embodiment of a filter compressor 102. Via the embodiment of the filter compressor 102, the intermediate filters of the subband filterbank 201 are provided with the compressed subband filter impulse responses Ĥ(n,k) that is used to filter the (complex-valued) QMF representation X(n,k).

In principle, as will also be explained later on, the complex QMF representation X(n,k) can be filtered by calculating the convolution of the complex QMF representation X(n,k) and the respective filter impulse response Ĥ(n,k) provided by the embodiment of the filter compressor 102 for each subband identified by the subband index k.

The filter signal provided by the subband filterbank 201 in the complex QMF domain is then provided to a QMF synthesis filterbank or complex synthesis filterbank, which finally synthesizes the (real-value) output signal y(n). A possible solution for a QMF synthesis filterbank 202 or a complex synthesis filterbank will be discussed in the framework of FIGS. 11 and 12.

In other words, in parallel to the filter converter 101 and the embodiment of the filter compressor 102, as shown in FIG. 1, the signal x(n) is input to a QMF analysis 203 module that outputs X(n,k), i.e. a complex QMF representation of the input signal. The signal is subsequently filtered 201 in the QMF domain using the complex QMF filter output by the filter compressor 102, and the filtered signal is finally synthesized to the time-domain by the QMF synthesis filterbank 202 producing the filtered output signal y(n).

Figure 3:
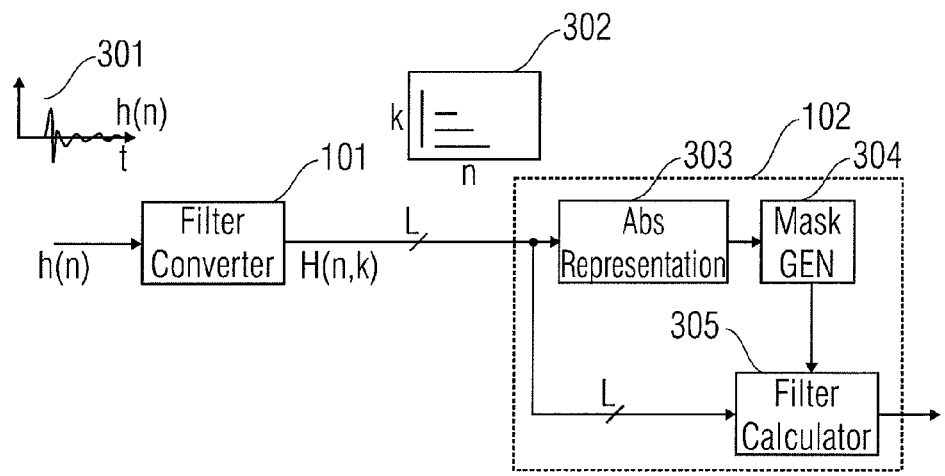
FIG. 3 illustrates an embodiment of the filter compressor according to the present invention.

In FIG. 3 a more detailed view of the embodiment of the filter compressor 102 is given. Again the time-domain filter h(n) as the input impulse response in the time-domain is input to the filter converter 101. The time-domain impulse response of the filter is displayed by 301. As explained earlier, after the filter converter the time-domain filter is transferred to the subband domain and is represented by H(n,k). An absolute valued time/frequency plot of the filter response is given by 302.

The embodiment of the filter compressor 102 shown in FIG. 3 comprises an absolute value representation module 303, which is connected to the input of the embodiment of the filter compressor 102. The embodiment of the filter compressor 102 furthermore comprises a mask generator 304, which is coupled to an output of the absolute value representation module 303. A filter calculator 305 is also comprised in the embodiment of the filter compressor 102, which is connected to both, the input of the embodiment of the filter compressor 102 and an output of the mask generator 304. The filter calculator 305 comprises an output, which also represents an output of the embodiment of the filter compressor 102.

The complex QMF filter or subband input filter H(n,k) is input to the embodiment of the filter compressor 102, that comprises the absolute value representation module 303, the filter mask generator 304, and the filter calculator 305. The absolute value representation module 303 creates an absolute valued time/frequency plot of the filters, as exemplified by the partial FIG. 302. This can, for instance, be a logarithmic representation of the absolute values of the filter coefficients in the QMF domain, as will be outlined later. The filter mask generator 304, selects or determines in one embodiment the coefficients (n,k) that have the largest values in the absolute valued representation of the filter in the QMF domain based on the information provided by the absolute value representation module 302. The filter mask generator 304 determines or selects an adjustable, programmable, fixed or predetermined number of coefficients that depends on the amount of filter compression that is desired. A lower number of selected filter coefficients gives a higher complexity reduction. Examples and more details will be explained in the further course of the application. In many cases in the framework of the present description, the words determining, selecting, deciding on, establishing and finding can hence be used synonymously. In many cases filter impulse response values being determined or selected are such filter impulse response values, which have (or comprise) higher values as compared to filter impulse response values having lower values than the higher values. These lower valued filter impulse response values are also referred to as being not selected or not determined.

As outlined earlier, alternatively or additionally, the complexity reduction may also be achieved based on examining the filter taps or filter impulse response values compared to the so-called aliasing level of the filterbank corresponding to the filter impulse response as provided to an embodiment of a filter compressor. If certain taps of the filter impulse response values in the QMF domain are close to the aliasing level of the filterbank, these filter taps may safely be set to zero or treated otherwise to reduce the computational complexity. These filter taps may then safely be disregarded in the case of an implementation of a filter as zero-valued coefficients are not required to be included in the framework of a multiply-add in an implementation of such a filter. For instance, after converting time-domain HRTF filters to a complex QMF representation, some of the time-frequency tiles in the complex QMF representation can have low absolute values at the aliasing level of the corresponding MPEG surround filterbank. These entries in the complex QMF representation of the HRTF filters may then be set to zero, which enables a complexity reduction for implementing long HRTF filters with room-response included.

The filter mask generator creates, based on the information provided by the absolute value representation module 302 a filter mask M(n,k) and outputs the selected filter mask M(n, k), indicating the selected filter coefficients of H(n,k) to the filter calculator 305. The filter calculator 305 produces a new, compressed filter Ĥ(n,k) from the original filter H(n,k) in the QMF domain comprising the selected filter coefficients. Further details on different possibilities concerning implementations will be given below.

Figure 4:
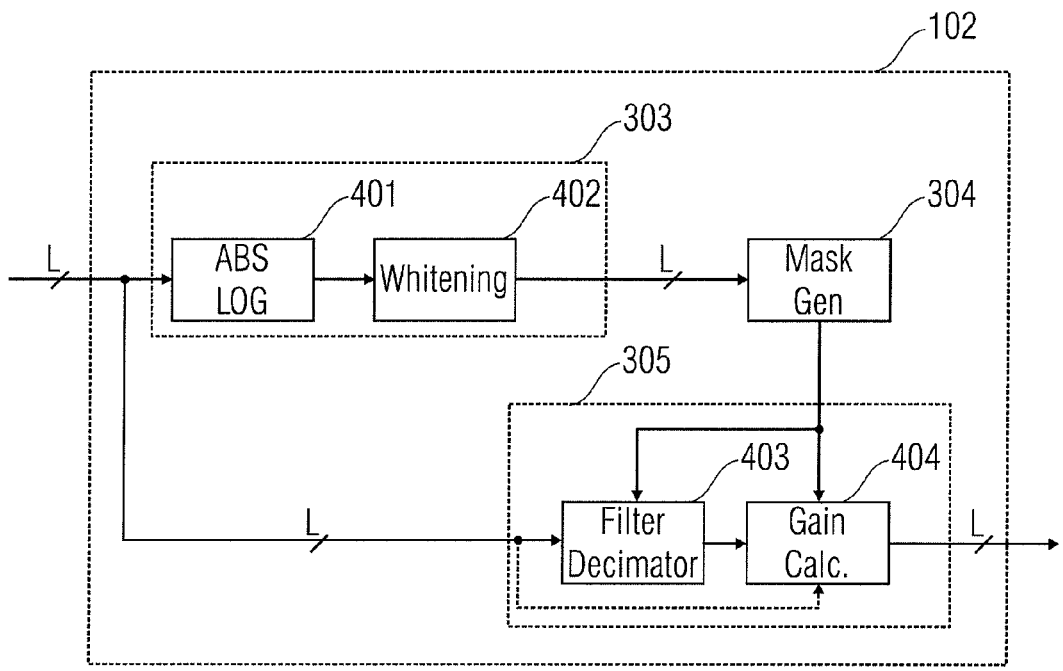
FIG. 4 illustrates a further embodiment of the filter compressor according to the present invention.

FIG. 4 shows a further embodiment of a filter compressor 102, which has the same basic structure as the embodiment of the filter compressor 102 shown in FIG. 3. To be more precise, the embodiment of the filter compressor 102 shown in FIG. 4 also comprises an absolute value representation module 303 which is on the one hand, connected to an input of the embodiment of the filter compressor 102 and on the other hand, via an output of the absolute value representation module 303 to a mask generator 304. The embodiment of the filter compressor 102 in FIG. 4 also comprises a filter calculator 305, which is also connected to the input of the filter compressor and to an output of the mask generator 304. An output of the filter calculator 305 once again represents an output of the embodiment of the filter compressor 102 shown in FIG. 4.

However, compared to the embodiment of a filter compressor 102 shown in FIG. 3, the absolute value representation module 303, as well as the filter calculator 305 are shown in more detail in the case of the embodiment shown in FIG. 4 and will be explained in more detail along with alternative or further implementations in the following sections of the present patent application.

The absolute value representation module 303 comprises an absolute value algorithmic function module 401, which is connected in series with a whitening module 402 in between the input and the output of the absolute value representation module 303. The filter calculator module 305 comprises a filter decimator module 403, which is connected in series with a gain calculator 404. Both, the filter decimator module 403 and the gain calculator 404 are connected in series between the input and the output of the filter calculator module 305. Depending on the concrete implementation, the information concerning the mask as provided by the mask generator 304 will be provided to the filter decimator module 403 and optionally also to the gain calculator module 404, as indicated in FIG. 4. However, also depending on the concrete implementation of the filter calculator module 305, the gain calculator module 404 may be optionally provided with the input subband filter impulse responses H(n,k), as provided to the embodiment of the filter compressor 102 via the optional connection between the gain calculator module 404 and the input of the filter calculator module 305, as indicated by the dashed line in FIG. 4

Before discussing the individual modules of the embodiments of the filter compressor 102 shown in FIG. 4 in more detail, a general overview of the functionality of the embodiment of the filter compressor 102 as shown in FIG. 4 will be given.

In FIG. 4 the different embodiment of the filter compressor 102 according to the present invention is outlined. Here the absolute value representation module 303 comprises the absolute values and logarithmic function 401, and a whitening module 402 that performs a spectral whitening of the absolute valued representation supplied by the absolute values and logarithmic function module 401. The filter mask generator 304 is the same as before, and outputs the filter mask M(n,k) to the filter calculator module 305. This comprises the filter decimator module 403 that keeps the selected coefficients of the filter H(n,k) and sets the other coefficients to zero in this embodiment, and the gain calculator module 404, that adjusts the gain of the filter so that the gain of the compressed filter Ĥ(n,k) is the same as that of the original filter H(n,k).

Starting with the absolute value representation module 303, the absolute value and algorithmic function module 401 is provided with the input subband filter impulse response H(n,k) and calculates an evaluation representation A(n,k) of the input subband filter impulse responses H(n,k), wherein once again n indicates the sample or index inside an individual subband filter impulse response, while k=0, ..., (L−1) represents the index of the subbands. The evaluation representation A(n,k) as calculated in the embodiment of the filter compressor 102 by the absolute value and logarithmic function 401 is carried out based on the following equation $$A(n,k)=20 \log_{10}|H(n,k)|. \quad (1)$$

The evaluation representation A(n,k) as indicated by equation (1) reflects a volume distribution with respect to the human ear without taking into account the specific acoustic characteristics of the human ear.

However, also different evaluation representations A(n,k) can be implemented in the framework of the absolute value representation module 303. As an example, in the embodiment shown in FIG. 3, the evaluation representation A(n,k) as provided by the absolute value representation module 303 to the mask generator 304 can, for instance be based on the equation $$A(n,k)=|H(n,k)|^s, \quad (2)$$

wherein s is a non-zero-valued real number and |...| indicates the absolute value of an expression. In some embodiments s is a non-zero-valued integer. While the evaluation representation A(n,k) according to equation (1) is based on a decibel scale based on the energy, the evaluation representation according to equation (2) corresponds to an energy in the case of the integer s=2. However, also other integers s, e.g. s=1 can be employed in calculating the evaluation representation A(n,k). Moreover, further ways of calculating the evaluation representation can be employed by, for instance, implementing psycho-acoustic models. It is important to note that in the embodiment shown in FIG. 4 as well as in the embodiment shown in FIG. 3, the filter converter 101 creates, based on the real-valued time-domain impulse response h(n) a complex-valued input subband filter impulse response H(n, k) so that for mathematical reasons, to be able to compare different impulse response values of the corresponding input subband filter impulse response H(n,k), a mathematical measure is advisable to be applied to the input subband filter responses. In the case of the embodiments shown in FIGS. 3 and 4 in connection with the equations (1), (2), this mathematical measure is the absolute value as indicated by |...|. However, in principle, other mathematical measures can also be applied, such as taking the real part, taking the imaginary part, taking the angle of the corresponding complex number with respect to the positive direction of the real-valued numbers in the plane of the complex numbers. In other words, although in the framework of the equations (1), (2) the complex values of the input subband filter impulse responses H(n,k) are transferred to the real-valued set of numbers by calculating the absolute value, also other mathematical measures as explained above can be utilized depending on the concrete implementation requirements.

The partial FIG. 302 in FIG. 3 schematically representing the evaluation representation A(n,k) can be understood as a three-dimensional plot of the evaluation representation A(n, k) as a function of the two indices k, n in the plane shown in FIG. 3, while the evaluation representation values A(n,k) are plotted perpendicular to the n-k-plane of the partial FIG. 302. In other words, the partial FIG. 302 shows a schematic representation of the evaluation representation of the absolute valued time/frequency representation of the filter A(n,k) as a function of the sample index or time index n and the subband index k. The time index or sample index n may differ from the index n of the time-domain impulse response h(n), for instance, by a factor of L (number of subbands). As will be explained in the context of FIGS. 9, 11 and 12, the filter converter 101 may comprise a complex-modulated analysis filterbank, which in turn may comprise one or more downsamplers, which reduce the number of samples by a factor, which can for instance be the number of subbands L. However, as these downsamplers are optional components, the index n may either refer to a time index or sample index comparable to the index n of the time-domain impulse response H(n), or may correspond to a downsampled time index or sample index differing from the time or sample index n of the time-domain impulse response H(n), for instance, by a factor of L.

In the following more details on the whitening module 402 will be outlined. The purpose of the whitening module taught by the present invention is to enable a perceptual weighing of filters prior to the mask generation in order to avoid the situation where perceptually important filter taps are discarded, because they have a small absolute value, in favor of other perceptually less important filter taps.

In one embodiment of the present invention, the absolute valued representation supplied by 401 in the logarithmic domain is given by $$A(n,k)=20 \log_{10}|H(n,k)|,$$

as shown in equation (1) in the case of the embodiment shown in FIG. 4. In the embodiment of FIG. 4, the whitening module 402 then starts by dividing the frequency into P perceptually relevant intervals of subbands with endpoints $k_0, k_1, \ldots, k_p$, $$I(p)=\{k_p, \ldots, k_{p+1}-1\}, \quad (3)$$

wherein P, $K_0, \ldots K_p$ are non-negative integers, while P is a positive integer.

For each p=0, 1, ..., (P−1), the whitened absolute value representation or evaluation representation $A_w(n,k)$ can then be defined by subtracting the maximum filter coefficient in the corresponding interval, according to $$A_w(n,k)=A(n,k)-\max_{l \in I(p)}\max_n A(n,l), k \in I(p), \quad (4)$$

wherein $A_w(n,k)$ is the whitened evaluation representation output by whitening module 402. In this context, it should be noted that whitening and weighing can be used synonymously in the framework of the present application.

Although the spectral whitening will be explained in more detail in the context of FIG. 14, and especially in view of the whitening as described by equation (4), it should be noted that the (spectral) whitening is based on the finding that it may be advisable to transfer energy from spectral parts to different spectral parts to prevent or to minimize distortion created in the course of the filter compression.

Real-life filters and audio systems very often have an unevenly distributed time/frequency distribution, which may result in the filter impulse responses in the subband domain having significantly larger lengths comparing subbands located at lower frequencies than subbands being located at higher frequencies. Furthermore, the unevenly distributed amplitude/frequency distributions of real-life filters and audio systems may also lead to different relevancies of the individual subband filters with respect to each other. In other words, for instance, due to a higher dampening of real-life filters and audio systems at higher frequencies subband filters corresponding to higher frequencies may be less important as compared to subband filters corresponding to lower frequencies. However, to prevent or at least to minimize effects a filter compression may have on the higher frequency subband filters, the (spectral) whitening can be favorably implemented to prevent in the scenario outlined above, subband filters at higher frequencies from being completely suppressed in the course of the compression, leading to severe distortions of the listening experience. Hence (spectral) whitening, also referred to as weighing, may be a crucial point for real-life filters and audio systems.

The whitening module 402 as comprised in the absolute value representation module 303 in the embodiment shown in FIG. 4, therefore applies a spectral whitening in which a normalization effect is employed by dividing the overall frequency range in frequency bands. As will be explained in more detail in the context of a complex modulated analysis filterbank, each subband corresponds to a specific frequency range with a specific center frequency. As a consequence, the subbands can be arranged according to the center frequencies. In a natural choice, the subband index k corresponds in increasing order to the center frequencies in increasing order.

To implement the spectral whitening in the form of the normalization effect with respect to the mentioned frequency bands, perceptually relevant intervals of subbands or subgroups of subbands are formed, which comprise at least one subband each. Moreover, in many concrete implementations, an individual subband belongs to exactly one subgroup as a whole. However, each subgroup of subbands may comprise more than one subband. In this case, a subgroup typically only comprises subbands with neighboring center frequencies.

In other words, if the subbands are arranged according to their center frequencies in an increasing order and at the same time according to an increasing subband index k, a subgroup only comprising subbands with neighboring frequencies relates to subbands with subband indices k, which can be arranged such that a maximum difference between two arranged subband indices is equal to +/−1 as explained in the context of equation (3). In other words, each frequency band can be represented by a subgroup or an interval of subbands, which is a superset of the subbands. However, it should be noted that a subgroup of subbands may also comprise exactly one subband.

As mentioned before, in the framework of spectral whitening, a specific number P of frequency bands, subgroups or intervals of subbands are distinguished. While, in principle the number of subgroups of subbands p is an integer, which is smaller than the number of subbands L due to the restriction that each subgroup at least comprises one subband and that each subband belongs exactly to one subgroup of subbands. In the case of a filter system operating on L=64 subbands, a typical number P of subgroups of subbands can be chosen to be 28. However, this number is not limiting as explained above. The corresponding number of subgroups of subbands P (e.g. P=32) can be chosen based on a psycho-acoustic model representing perceptually relevant intervals in frequency domain.

The whitening therefore leads in many real-life filters and audio systems to a transfer of the energy from lower spectral parts to higher spectral parts, optionally based on the perception characteristics of the human ear with respect to psycho-acoustic models.

However, also different implementations of the whitening module 402 can easily be implemented in the framework of the absolute value representation 303. To be more precise, alternative implementations comprise the possibilities of individually whitening the evaluation representations $A(n,k)$ for each subband with index k instead of the performing the whitening based on all subbands comprised in the respective subgroup of subbands according to equation (4). Furthermore, instead of subtracting the maximum value as shown in equation (4), a whitening may be performed by dividing all values of the evaluation representation $A(n,k)$ and thereby normalizing all values of the evaluation representation with respect to the maximum of each subband or with respect to the maximum value of each subgroup of subbands. Furthermore, the described normalization by dividing the valuation representation can also be carried out such that the sum of all values of the respective evaluation representation $A(n,k)$ (either with respect to each individual subband or with respect to each subgroup of subbands) can be carried out. In this case, in the first step the sum of all values of the evaluation representation with respect to the respective subband or the respective subgroup of subbands will be determined, which is then followed by the subtracting according to equation (4) or by dividing the values of the evaluation representation with the respective sum value.

To summarize, in the embodiment outlined above, the examination as well as the selecting is based on the absolute value of the filter impulse response values at the filter taps. Hence, in this embodiment, the filter impulse response values are selected or not selected based on a comparison concerning the absolute values of the filter taps when selecting at least one comprising a higher value. In different embodiments, the comparison or examination of the filter taps may be based on applying other mathematical measures, if desired. If the filter taps are real-valued, in principle an application of a mathematical measure is not required, however, calculating or determining the absolute value may be implemented.

In the case of complex-valued filter taps, applying some mathematical measure may be advisable. Examples can be deriving the absolute values or deriving the angles or phases of the filter taps with respect to a predetermined or well defined direction in the plane of the complex numbers (e.g. the direction of the positive real numbers). Moreover, determining the real part, the absolute value of the real part, the imaginary part, the absolute value of the imaginary part or any other function mapping the respective complex numbers onto the (optionally positive) real numbers can in principle be applied.

In the embodiment shown in FIG. 4, the whitened evaluation representation $A_W(n,k)$ as output by the whitening module 402 is provided to the mask generator 304, which creates a filter mask or mask M(k) based on the whitened evaluation representation. Due to the fact of the whitening module 402 on the evaluation representation, the mask generator 304 is now capable of selecting the most (perceptually) relevant filter coefficients. The filter mask is in the embodiment shown in FIG. 4, a set of 0s and 1s, wherein M(n,k)=1 indicates the corresponding filter tap or filter impulse response value is selected to be used or kept. Accordingly, the value M(n,k)=0 indicates that the corresponding filter tap or filter impulse response value identified by the sample index or time index n and the subband index k is not selected and will hence not be used. In other words, the specific filter impulse response value will be disregarded or set to zero.

The concrete implementation of a mask generator 304 can substantially differ from one embodiment to the next embodiment of a filter compressor 102. In the embodiment shown in FIG. 4, the mask generator can, for instance, choose a specific number of impulse response values, based on the whitened evaluation representation $A_W(n,k)$ by setting the corresponding values of the filter mask M(n,k)=1, whereas the remaining values in the filter mask are set to 0. Apart from choosing a specific absolute number of impulse response values, also a relative number with respect to the overall number of impulse response values given by the set of subband filter responses H(n,k) is possible. In a concrete example in the case of a L=64 QMF subband implementation wherein each input subband filter impulse response comprises 16 non-zero, non-vanishing or non-trivial filter taps, the overall matrix of the input subband filter responses is given by a 64·16 matrix containing 1024 impulse response values. In this example the mask generator 304 can, for instance, choose a specific predetermined number of the impulse response values (e.g. 256 elements according to the greatest absolute values as provided by the whitened evaluation representation) or the mask generator 304 can select a predetermined or specific ratio (relative number) of the filter impulse responses with respect to the overall number of filter impulse responses (e.g. 25% of the overall number of filter-response values). In both cases, the rest of the impulse response values will be disregarded or not selected by setting the corresponding values of the filter mask M(n,k) equal to zero (M(n,k)=0).

In a further embodiment of a filter compressor 102, the mask generator 304 may be adapted to receiving a signal indicative of the absolute number of impulse response values to be selected or indicative of the ratio of impulse response values with respect to the overall number of impulse response values. In such an embodiment of a filter compressor 102, the compression ratio can be adjusted by adjusting the previously mentioned figures.

Furthermore, the mask generator 304 may alternatively or additionally, be adapted to selecting the respective filter impulse response values based on different criteria. As an example, the mask generator 304 may be adapted to selecting a predetermined, fixed, programmable, or adaptable number of impulse response values per subband (e.g. the 3 impulse response values having the maximum values with respect to the evaluation representation for each subband). Furthermore, the mask generator 304 may be adapted such that a threshold criteria holds, so that for instance, all impulse response values are selected, the corresponding evaluation representation values of which are larger than a predetermined, fixed, adjustable or programmable threshold value. In a further embodiment, it may be advisable to adapt the mask generator 304 such that it is capable of selecting the impulse response values, based on a comparison of the respective value, with its neighboring impulse response values. As an example, mask generator 304 may be adapted such that a filter impulse response value is not selected if the respective value is in view of the (optionally whitened) evaluation representation smaller than a fixed, predetermined, programmable or adjustable ratio compared to the neighboring values (e.g. smaller than 25%). However, other selection schemes can also be implemented.

However, due to the whitening, as described in the context of equation (4), based on each subgroup of subbands, or each individual subband, at least one impulse response value is selected in each subgroup of subbands or in each subband, depending on the concrete implementation, although the number of selected impulse response values may substantially differ from one subband to the next subband, or from one subgroup to the next subgroup. In the case of the whitening carried out by dividing the evaluation representation A(n,k) by, for instance, the maximum value of the corresponding subset of evaluation representation values, in the above described implementation of the mask generator 304, at least one filter impulse response value is selected in each subband or in each subgroup of subbands, as will be explained in the context of FIG. 14.

As a consequence, the interplay of the absolute value representation module 303 and the mask generator 304 will lead to a concentration to the important areas of the filter impulse response values in the n-k-plane (cf. partial FIG. 302 in FIG. 3), and to a "compression" of "vacuum" or "air" in between the perceptually relevant areas of the n-k-plane. The relevant impulse response values will be disregarded by setting the mask M(n,k) accordingly.

The filter calculator module or filter impulse response constructor, also referred to as the filter calculator module 305, comprises in the embodiment shown in FIG. 4 as one element, a filter decimator 403, which sets all the non-selected filter taps or filter impulse response values to zero, as indicated by the filter mask M(n,k). The decimator 403 outputs in this case a masked matrix of a subband filter impulse responses $H_M(n,k)$, which is equal to the corresponding matrix element of the subband filter impulse responses H(n,k), if the corresponding filter mask value M(n,k) is equal to 1. If, the filter mask of a corresponding filter impulse response value M(n,k) is set to 0, the masked matrix of subband filter impulse responses $H_M(n,k)$ is set to 0. In other words, the mask M(n,k) from the mask generator 304 is applied to the in the filter decimator 403 to form a decimated filter $$H_M(n,k)=M(n,k)H(n,k). \qquad (5)$$

In this embodiment, the mask consists of entries that are either zero or one. The entries with zeros describe which filter coefficients are to be discarded and the entries with ones describe which filter coefficients are to be kept (selected).

In the following more details on the gain calculator module 404 comprised in the filter calculator module or rather filter impulse response constructor 305 is outlined. The purpose of the gain calculator module 404 taught by the present invention is to readjust the power gain of the decimated filters such that the final gain adjusted compressed filter has the same main spectral characteristic as the original filter. As the power gain of the decimated filter is lower than the original filter a compensation gain is computed in the gain calculator module 304 for each subband. In one embodiment of the present invention this gain is defined by $$G(k) = \min\left\{G_{max}, \left(\frac{\sum_n |H(n,k)|^2}{\varepsilon + \sum_n |H_M(n,k)|^2}\right)^{1/2}\right\}, \quad (6)$$

wherein min{ ... } refers to the minimum, $G_{max}$ is a maximum gain, and $\varepsilon$ is a small (positive) number, typically significantly smaller than the second addend of the denominator of equation (6).

This gain is applied to the decimated filter in order to obtain the final compressed filter $$\hat{H}(n,k) = G(k) H_M(n,k). \quad (7)$$

In a further, different embodiment of the current invention, a gain is computed only for each perceptually relevant interval of subbands (subgroup of subbands), $$G(p) = \min\left\{G_{max}, \left(\frac{\sum_n \sum_{k \in I(p)} |H(n,k)|^2}{\varepsilon + \sum_n \sum_{k \in I(p)} |H_M(n,k)|^2}\right)^{1/2}\right\}, \quad (8)$$

and the same gain is applied in each interval or subgroup, $$\hat{H}(n,k) = G(p) H_M(n,k), k \in I(p), p = 0, 1, \ldots, P-1. \quad (9)$$

In both cases, $G_{max}$ is an upper bound on the gain compensation and $\varepsilon$ is a small positive number included for avoiding division with zero. Both, $G_{max}$ and $\varepsilon$ are therefore numbers, which are useful in a numerical implementation of the gain calculator 404 to prevent a division by a zero (i.e. $\varepsilon > 0$), and to limit the gain applied by the gain calculator module 404 to a subband to the value as defined by the maximum gain $G_{max}$, as due to the minimum of the two terms in the braced brackets in the equations (6), (8), the respective gains G(k) and G(p) are limited to the value of $G_{max}$.

In other words, adjusting the gain in each of the P frequency bands or rather subgroups of subbands keeps the energy of the signal filtered by the respective subband filter in a very good approximation constant, when comparing the masked and non-masked subband filter impulse responses $H_M(n,k)$ and $H(n,k)$. The energies of the signals filtered with the respective filters based on the filter impulse responses are in both cases proportional to the sum of the squares of the absolute values of the respective subband filter impulse response values, as indicated by the expressions $$E \propto \Sigma |H(n,k)|^2 \quad (10a)$$

and $$E \propto \Sigma |H_M(n,k)|^2 \quad (10b)$$

for the masked and the original input subband filter impulse response values. As can easily be verified, the gain G(k) and G(p) in the equations (6), (8), are based on a comparison of the two energies as outlined in equations (10a) and (10b), wherein the additional addend $\varepsilon$ has only been introduced to the equations (6), (8), to avoid in a concrete implementation a division by zero.

Therefore, a gain calculator module 404 normalizes the masked filter taps $H_M(n,k)$ with respect to the energy to compensate the energy lost in the course of the masking of at least some of the input subband input responses. In other words, due to the masking in the framework of the filter decimator 403, a signal filtered with a subband filter input response corresponding to the masked subband filter impulse responses $H_M(n,k)$ will have a lesser energy compared to a subband filter employing the subband filter impulse responses $H(n,k)$.

However, in the gain calculator module 404 can also be adapted to applying a different gain scheme. As an example, not so much the energy but a direct comparison of the absolute values of the subband filter impulse responses can be employed to determine a gain factor. Additionally, or alternatively, the gain factor G can also be determined, based on the overall number of subband filter impulse response values, rather than the impulse response values of an individual subband or an individual subgroup of subbands, as explained in the context of equations (6) and (8). Moreover, it should be noted that a gain calculation module 404 is not a required component, but rather an optional component.

The filter impulse response constructor or filter calculator module 305 can in further embodiments of the present invention, be capable of constructing the compressed subband filter impulse responses, not only by setting the non-selected subband filter impulse response values to zero as explained above. Depending on the concrete implementation, the filter impulse response constructor 305 can achieve this, for instance, by weighing, copying or taking the appropriate selected or determined subband filter impulse response values to construct the compressed subband filter impulse responses.

In this context, it should be noted that even disregarding or not including not determined or not selected filter impulse response values does not lead to a compression of the filter in time. In the framework of the present description neglecting, ignoring or not using not selected or not determined filter impulse response values does not lead to a significant change of the order of individual addends of the polynomial expression of the corresponding (QMF filterbank) polynomial expression apart from the pure modifications to the coefficients of the delaying-operators z−1. In other words, by disregarding, neglecting, setting to zero or otherwise not further regarding a filter tap or a filter impulse response value does not lead to a new distribution of filter taps with respect to the power of delaying-operators z−1. A filter tap or filter impulse response value following such a not selected or not determined filter impulse response value, which is selected or determined, will not be altered in terms of the power of the delaying-operators.

In other words, the compressed subband filter impulse responses, as constructed by the filter impulse response constructor 305, may comprise zero-valued values corresponding to the filtered taps of not-selected filter impulse response values or the compressed subband filter impulse responses may not include the respective not-selected filter impulse response values at all. In yet other words, the filter impulse response constructor 305 can, for instance be capable of constructing a compressed subband filter impulse response having in principle the same number of subband filter impulse response values as the input subband filter impulse responses, but with an increased number of zero-valued values or the compressed subband filter impulse responses may have a shorter overall length, as the filter impulse response constructor 305 only copies the selected values and disregards the not-selected values.

As real valued filter impulse response values lead to a significant complexity reduction compared to complex-valued filter impulse response values, the filter impulse response constructor 305 can also advantageously output the absolute values of some of the selected filter impulse response values. This mode of operation is particularly attractive in subbands corresponding to higher frequencies where the human hearing is less sensitive to phase relations.

As a consequence, subband impulse response values of subbands corresponding to center frequencies above a border frequency can optionally be replaced by an absolute value, an imaginary part, a real part, a phase, a linear combination, a polynomial combination or a real-value expression of at least one of the aforementioned elements. The imaginary part of a complex value is also considered to be a real-valued number in the framework of the present description. Depending on the concrete implementation, the border frequency can be in the range of 1 kHz to 10 kHz, whereas in many applications an implementation of a border frequency in the range between 1 kHz to 5 kHz or 1 to 3 kHz may be utilized considering a typical hearing characteristic of a human being. Moreover, depending on the concrete implementation of a filter compressor, the described replacement of a complex-valued filter impulse response value by a real-valued value based on the complex-valued filter impulse response value may be implemented depending on the filter impulse response value being selected or determined or not being selected or not being determined. Alternatively or additionally, filter impulse response values belonging to subbands corresponding to center frequencies above the border frequency may generally be replaced by corresponding real-valued values based on the complex-valued filter impulse response values. In this context it should be noted that using determined or selected filter impulse response values also comprises using (e.g. real-valued) values based on such filter impulse response values to replace the corresponding filter impulse response values.

Figure 5:
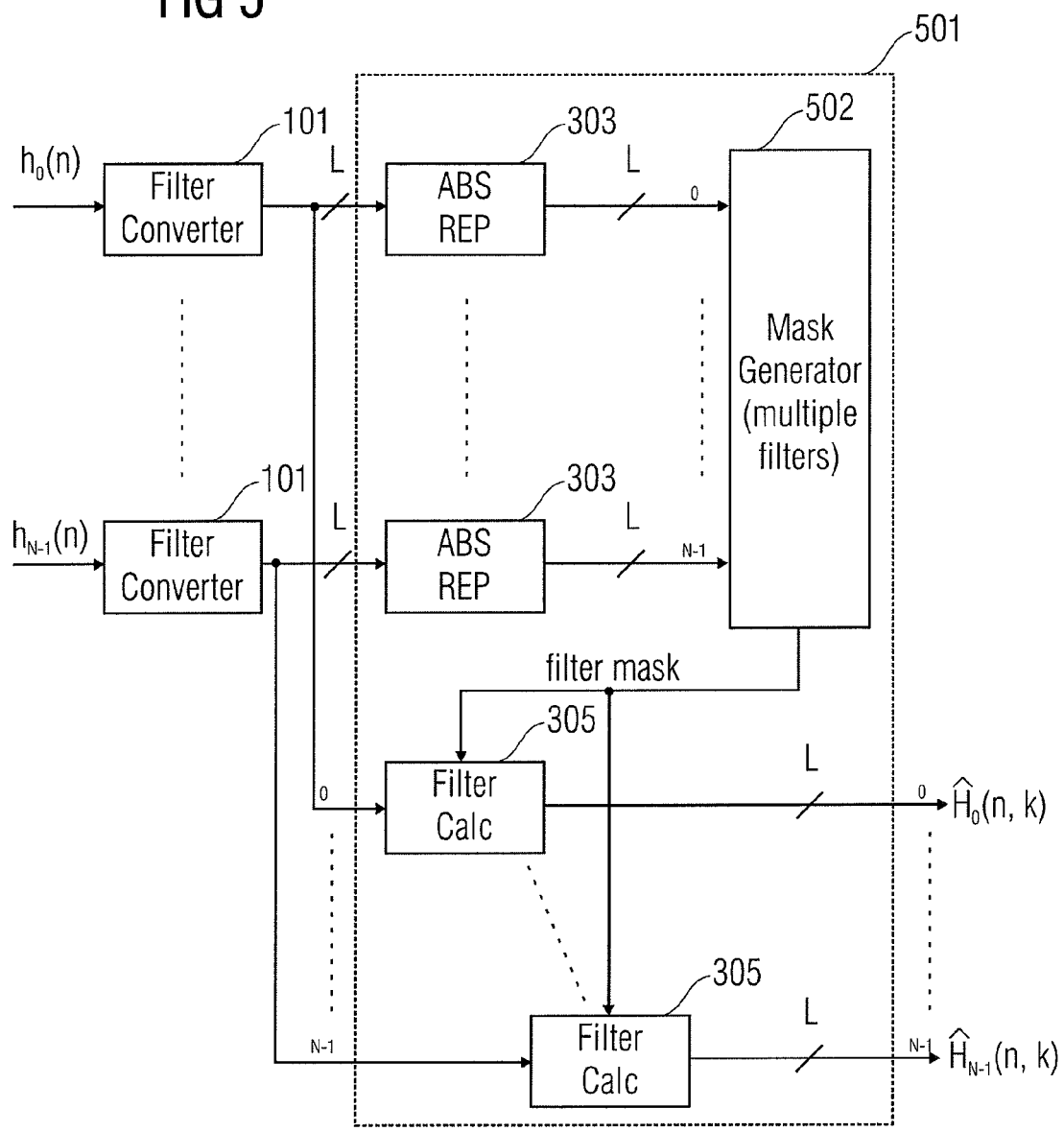
FIG. 5 illustrates a further embodiment of the filter compressor according to the present invention operating on multiple filters simultaneously.

FIG. 5 shows further embodiments of a filter compressor 501, according to the present invention operating on multiple filters simultaneously. In FIG. 5 a different embodiment is outlined. Here multiple filters (N filters, indicated by $v=0, \ldots, (N-1)$, N being a positive integer, are input to the embodiment of the filter compressor 501, wherein each filter is input to an individual absolute value representation module 303 and the N representations are input to a filter mask generator 502.

To be more precise, the embodiment of a filter compressor 501 shown in FIG. 5 is connected or coupled to a set of N filter converters 101 to which a set of real-valued time-domain impulse responses $H^v(n,k)$ is supplied to, wherein as previously explained, $v=0, \ldots, (N-1)$ is the index of the corresponding filter in the time-domain. As an example, in the case of a five-channel input signal in the framework of a HRTF-like system, for each of the five input channels and for each of the two headphone channels (left and right), an individual time-domain filter is employed leading to a total number of N=10 time-domain filters.

In other words, the filter compressor 501 shown in FIG. 5 is provided with a plurality of sets of impulse responses, wherein each set of filter impulse responses of the plurality of sets is provided by a different filter converter 101 in the case illustrated in FIG. 5. However, with respect to one set of filter impulse responses as provided by an individual filter converter 101, the set of filter impulse responses comprises L individual filter impulse responses, each having a specific number of filter taps or filter impulse response values. As previously explained in the context of the center frequencies, each filter impulse response corresponding to an individual subband is associated to a center frequency thereby the center frequencies form a plurality of center frequencies.

Filter impulse responses corresponding to the same subband index k, but belonging to different sets of filter impulse responses as indicated by the index v, also correspond to the same center frequency. In other words, to each center frequency of the plurality of center frequencies (as defined by one set of filter impulse responses) corresponds (exactly) one filter impulse response in each of the sets of filter impulse responses, at least before the compression.

Each of the filter converters 101 provides for each of the time-domain filters, a set of complex valued subband filter impulse responses $H^v(n,k)$, which are provided to the embodiment of the filter compressor 501 shown in FIG. 5. Each of the subband filter impulse responses for the N different time-domain filters is provided to an individual absolute value representation module 303, which provides an absolute value representation or an evaluation representation for each of the N time-domain filters to the filter mask generator 502. The absolute value representation modules 303 can be taken from one of the other embodiments of an inventive filter compressor outlined in the present application as indicated by the same reference sign.

In the following, more details on the filter mask generator 502 for multiple filters are outlined. Given the absolute value representation of N filters $$A^v(n,k), v=0, 1, \ldots, N-1$$

As provided by the N absolute value representation modules 303, one embodiment of the filter mask generator 502 for multiple filters forms a joint absolute value representation defined by the mean value $$A(n,k) = \frac{1}{N}\sum_{v=0}^{N-1} A^v(n,k). \quad (11)$$

This (joint) absolute value representation forms the basis for a single mask generation M(n,k) exactly as in the single filter mask generator 304 in the previous embodiments. In case a whitening step is performed, this can either be done for each individual absolute value representation modules 303 or performed only once for the joint absolute value representation.

Figure 15:
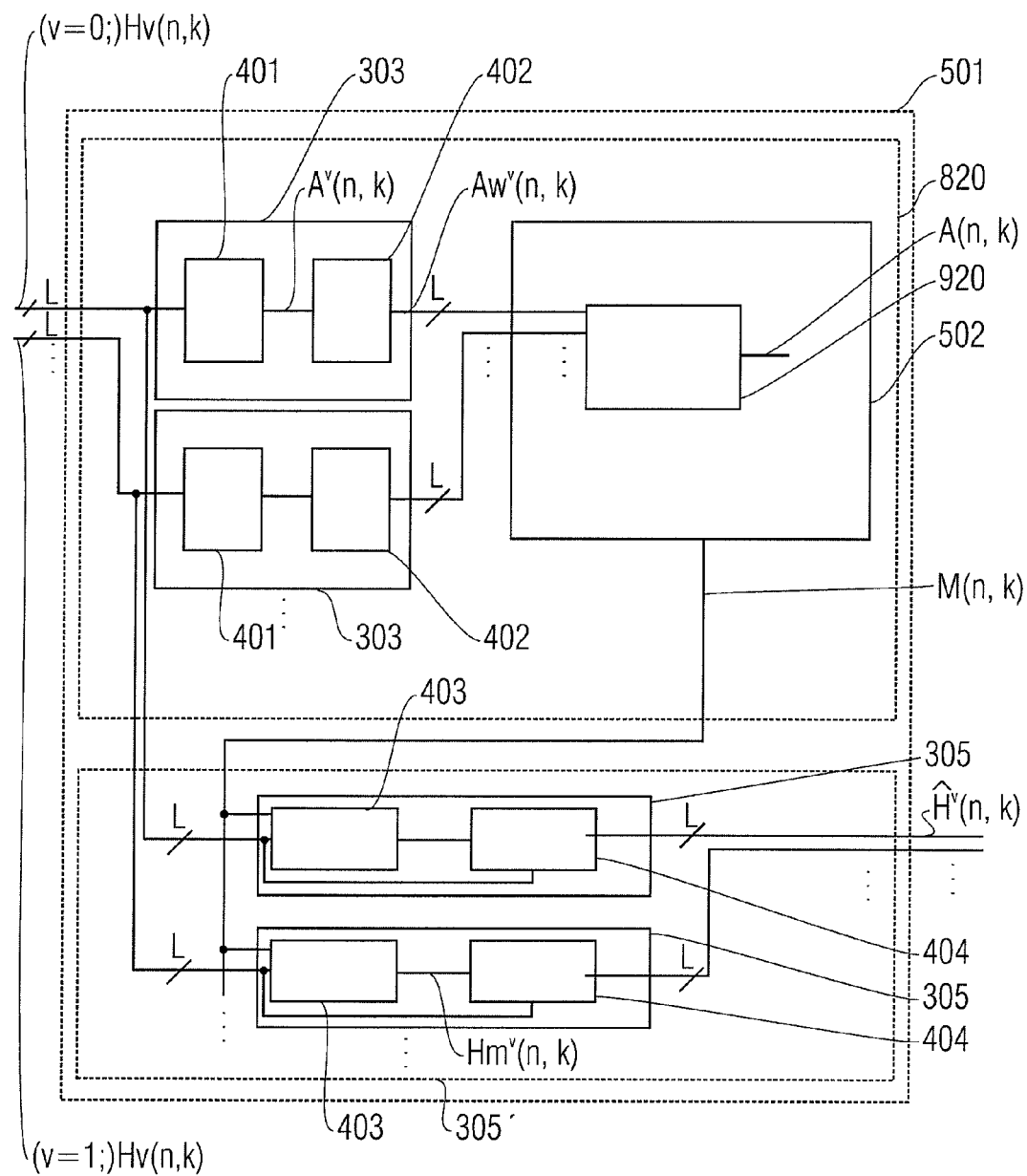
FIG. 15 illustrates an embodiment of a filter compressor according to the present invention operating on a multiple filters simultaneously.

In the context of FIG. 15 an embodiment of a filter compressor 501 will be discussed in which the (spectral) whitening is performed for each filter $v=0, \ldots, (N-1)$ individually. The filter mask generator 502 in this embodiment creates a single filter mask M(n,k) for all filters based on the N absolute value representation of all filters. This is a great advantage of the embodiment of the present invention, since the filter mask generator 502 can take into account how the compressed filters will be combined in a later state. Each of the original filters is input to a filter calculator 305 as outlined before, and the filter compressor produces N new filters $A_W^v(n,k)$, as each of the filter calculators is provided with the same mask M(n, k).

However, in a further embodiment of a filter compressor 502, the (joint) absolute value representation may alternatively be defined by $$A(n,k) = \sum_{v=0}^{N-1} \omega(v) \cdot A^v(n,k), \quad (11')$$

wherein $\Omega(v)$ is a weighing factor depending on the filter index $v=0, \ldots, (N-1)$. The weighing factors $\Omega(v)$ offer the possibility of weighing the different filters v, depending on their spectral, psycho-acoustic or other relevance for the overall acoustic impression. It might be advisable, although not necessary, to define the weighing factors $\Omega(v)$ such that the sum of the weighing factors is equal to one so that the following expression holds:

$$\sum_{v=}^{N-1} \omega(v) = 1. \qquad (11'')$$

Compared to equation (11), the (joint) absolute value representation A(n,k) of equation (11') can be transformed into the result of equation (11) by defining an equally distributed weighing factor $\Omega(v)=1/N$. In other words, the calculation of the absolute value representation according to equation (11) represents a specialized form of the absolute value representation according to equation (11') which offers a greater flexibility as it allows for weighing of the perceptual importance of the respective filters indicated by the index v.

By using the same filter mask M(n,k) for each of the N individual filters in the time-domain, the embodiment of the filter compressor 501 is capable of creating a set of compressed subband filter impulse responses for each of the N filters such that even a post-processing of the N individual subband filters after the filter compressor 501 will not lead to a resulting compressed subband filter impulse response having an entry with a relevant impulse response value that does not have corresponding selected impulse response value in one of the other filters. Comparing the mask generator 502 of the embodiment shown in FIG. 5 with the mask generators 304 of the embodiment shown in FIGS. 3 and 4, it is important to note that the mask generator 502, although provided with N input subband filter impulse responses for N individual filters in the time-domain only, produces a single mask M(n,k) indicative of all the N subband filter impulse responses.

In further embodiments of a filter compressor 501, different mask generators 502 may be employed, which can in principle use different schemes to provide a common evaluation representation for all the N filters in the time-domain. In other words, apart from applying the average, as indicated in equation (11), the individual evaluation representations as provided by the absolute value representation modules 303 may be combined to a single evaluation representation by summing the respective values, by linear combining the respective values, wherein, for instance, a weighing with respect to the subbands involved can be implemented, or by employing a more complex combination (e.g. a quadratic or higher order combination) of the respective values of the evaluation representations.

Figure 6:
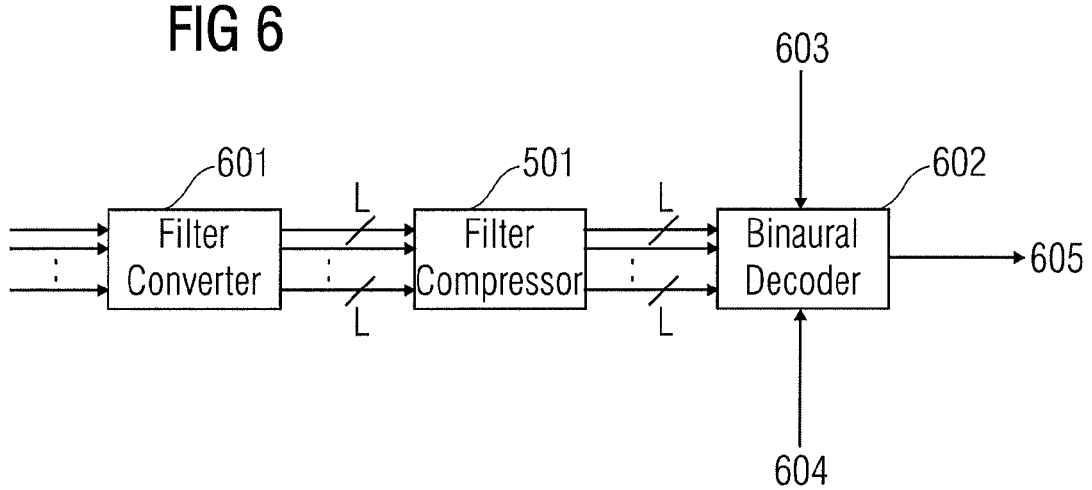
FIG. 6 illustrates a embodiment of the present invention used in the context of HRTF filtering.

In FIG. 6 an embodiment of the present invention in the context of binaural decoding using HRTFs is outlined. As previously explained, ten HRTF filters are input to a filter converter 601, which comprises ten (N=10) filter converters according to 101 (cf. a filter converter 101 shown in FIG. 1). The filter converter 601 receives a total of N·L filter impulse responses, wherein L is again the number of subbands. The ten HRTF filters in the QMF domain representation are input to an embodiment of a filter compressor 501, as outlined above, and provide ten compressed and optionally gain adjusted filters H$^v$(n,k). The ten compressed filters H$^v$(n,k) (v=0, . . . , 9; N=10) are input to a binaural decoder 602 that given the stereo input signal 603, spatial parameters 604 produces a binaural stereo signal 605 that gives a surround sound impression over a stereo channel (e.g. a headphone). The binaural decoder 602 accomplishes this by linearly combining the ten HRTF filters into four HRTF filters that are applied to the stereo input signal. The embodiment of the filter compressor 501 is designed to create the same filter mask for all filters, so that when they are linearly combined, an entry in one filter that has been set to zero does not have a corresponding non-zero entry in any other filter. As a consequence, each connection coupling the filter converter 601, the filter converter 501 and the binaural decoder 604 transfers information concerning L subbands as indicated by the slash in FIG. 6.

As already previously explained, the binaural decoder 602 combines the 10 (five audio input channels for two audio output channels (stereo)) into four HRTF filters, which can immediately be applied to the stereo input signal 603. However, the HRTF filters do depend on the spatial parameters 604 provided to the binaural decoder 602 to render the binaural stereo signal 605. As mentioned earlier, especially HRTF filters can comprise a substantial number of non-trivial, non-zero or non-vanishing subband filter impulse response values as filter taps, as often very complex interactions between the binaural stereo output signals for the human ear and the sound sources have to be modeled. The respective HRTF filters, can for instance become substantially long in order to effectively model the room characteristics of the environment and other influences to be modeled.

Especially in this context, embodiments of a filter compressor 501 can efficiently be applied to reduce the computational complexity in terms of the binaural decoder 602 significantly. By reducing the number of relevant subband filter impulse response values to be considered in the framework of the binaural decoder 602, the binaural decoder 602 can be implemented with lesser computational power, which ultimately leads to a lower energy consumption, as for instance the clock rate of the corresponding binaural decoder can be reduced due to a lower number of calculations in a given period of time. Alternatively, the binaural decoder 602 can be built smaller for the same reasons so that in principle a second processing core may be avoidable.

As will be outlined in the context of FIGS. 7 to 13 in more detail, employing a filter converter with 192 (=3·64) filter taps used to convert 10 time-domain HRTF filters into the complex QMF domain or complex subband domain, a HRTF filter in the time-domain with 896 (=14·64) filter taps will be transferred by the filter converter 601 or rather the 10 filter converters 101, as shown for instance in FIG. 1, into 64 individual subband filter impulse responses, comprising 16 (=14+3−1) filter taps each. The resulting 1024 filter taps for each of the 10 time-domain HRTF filters will result in a substantial computational strain for the binaural decoder 602, unless an embodiment of the filter compressor 501 is employed to reduce the overall number of filter taps, for instance by a factor of 4 to 256 (=1024/4). Although this example is based on a system comprising L=64 subbands for each of the 10 HRTF filters in the complex QMF or subband domain, in principle any number of L subbands can be employed.

Before further embodiments of a filter compressor and the method for manufacturing compressed subband filter impulse response filters are discussed, a possible solution for a filter converter and a filter operating in a complex subband domain (QMF domain) will be explained in more detail. However, before discussing the technical background in more detail, especially of a filter converter, the general concept of applying a digital filter to a digital audio input (in the time-domain or in the subband domain) shall be discussed.

Figure 7:
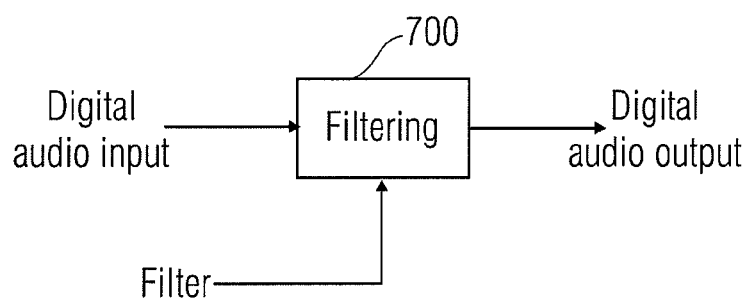
FIG. 7 illustrates a possible solution for an adaptable filter.

FIG. 7 shows a possible solution for a filter or filtering element 700, to which a digital audio input is provided. It should be noted that the digital audio input could in principle be both, a time-domain signal and a signal in the (complex) subband domain. The filter element provides at an output, a digital audio output, which represents the filtered digital audio input, depending on a filter definition signal or a respective filter impulse response signal.

With the sample or time index n, a digital audio input x(n) being either a real-valued or a complex-valued input signal, depending on the domain involved, and the digital audio output signal y(n), as well as the impulse response signal f(n) of the filter 700, the digital audio output signal is given by $$y(n) = \sum_l f(l) \cdot x(n-l), \qquad (12)$$

wherein l is a summing index used to calculate the resulting digital audio output signal, based on the convolution as given by equation (12).

Figure 8:
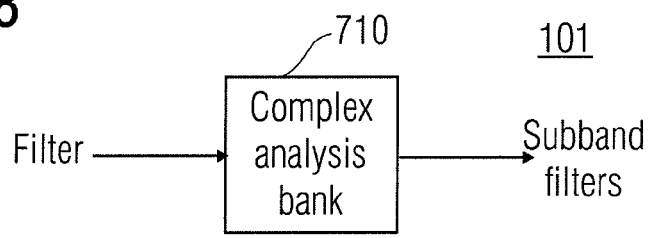
FIG. 8 illustrates a possible solution for a key component of a filter converter.

A filter converter 101 comprises, as shown in FIG. 8 a complex analysis filterbank 710 as a central component to which the corresponding filter impulse response signal is provided. The complex analysis filterbank 710 analyzes impulse response signals of the filter in the time-domain, which is to be transferred into the QMF domain, by means of filtering with a set of L analysis filters, followed by an optional downsampling of a factor L, wherein L is once again the positive integer, advantageously larger than 1 and indicating the number of subbands of the complex analysis filterbank 710. The analysis filters are usually obtained by a complex modulation of a prototype filter q(n), wherein n is once again a positive integer indicating the index in an array of data or an index of a value in a signal. The output of a filterbank 710 consists of L subband signals, which as a whole, represents the filter characterized by its filter impulse response in the time-domain in the complex QMF domain. To be more precise, the output of a complex analysis filterbank 710 is a set of subband filter impulse responses, which can be provided to a filter element 700 to perform a filtering of an audio input signal in the complex QMF domain, which leads to a perceptually indistinguishable difference of the audio output signal, compared to a direct filtering in the time-domain.

More details concerning both, the prototype filter q(n) as well as the basic design of a complex modulated analysis filterbank will be outlined, and more closely explained later on. Moreover, in the following, the number of subbands is assumed to be fixed at L=64. However, as previously explained, this is not a restriction of embodiments of the present invention, but merely serves as a suitable example.

Figure 9:
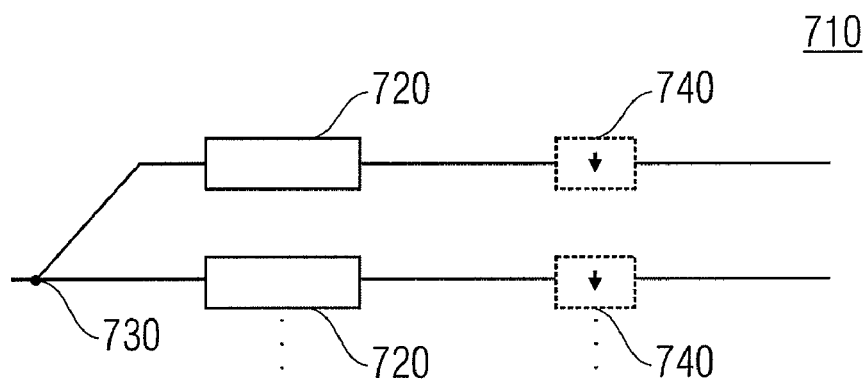
FIG. 9 illustrates a possible solution of a (complex) analysis filterbank.

FIG. 9 shows a possible solution of a complex analysis bank 710 in more detail. The complex analysis bank 710 comprises a plurality of L intermediate analysis filters 720 for each subband to be output by the complex analysis bank 710. To be more precise, each of the L intermediate analysis filters 720 is connected in parallel to a node 730 to which the time-domain impulse response signal as an input signal to be processed is provided. Each of the intermediate analysis filters 720 is adapted for filtering the input signal of the complex analysis bank 710 with respect to a center frequency of each subband. According to the center frequencies of the different subbands, each subband is labeled by a subband index or index k, wherein k is again a non-negative integer, typically in the range from 0 to (L−1). The intermediate analysis filters 720 of the complex analysis bank 710 can be derived from a prototype filter p(n) by a complex modulation according to the subband index k of the subband to which the intermediate analysis filter 720 is applied. More details concerning the complex modulation of a prototype filter are explained below.

Either directly by the intermediate analysis filters 720 or by an optional downsampler 740 (denoted by dotted lines in FIG. 8 the sampling frequency of the signal output by the intermediate analysis filters 720 is reduced by a factor L. As mentioned before, the downsamplers 740 supplied to each subband signal output by the corresponding intermediate analysis filters 720 are optional as, depending on the concrete implementation, the downsampling can also be carried out in the frame work of the intermediate analysis filters 720. In principle, downsampling the signal output by the intermediate analysis filters 720 is not required. Nevertheless, the presence of the explicit or implicit downsamplers 740 my be a favorable option in some applications as the amount of data provided by the complex analysis bank 710 would alternatively be raised by a factor of L, leading to a significant redundancy of data.

FIG. 10 shows a possible solution a subband filtering 750 and its interplay with the filter converter 101 in more detail. The subband filtering 750 comprises a plurality of intermediate filters 760, wherein one intermediate filter 760 is provided for each complex valued subband signal provided to the subband filtering 750. Hence, the subband filtering 750 comprises L intermediate filters 760.

The filter converter 101 is connected to each of the intermediate filters 760. As a consequence, the filter converter 101 is capable of providing the filter taps for each of the intermediate filters 760 of the subband filtering 720. More details concerning the filtering done by the intermediate filters 760 will be explained in the further course of the application. Hence, the filter taps provided to the different intermediate filters 760 and output by the filter converter 101 form the intermediate filter definition signal.

Furthermore, it should be noted that the embodiments, solutions and implementations could comprise additional and/or optional delays for delaying any of the signals or a subset of signals, which have been omitted in the figures. Nevertheless, delays or delayers can be comprised in elements shown (e.g. filters) or added as optional elements in all embodiments, solutions and implementations, depending on their concrete implementation.

Figure 11:
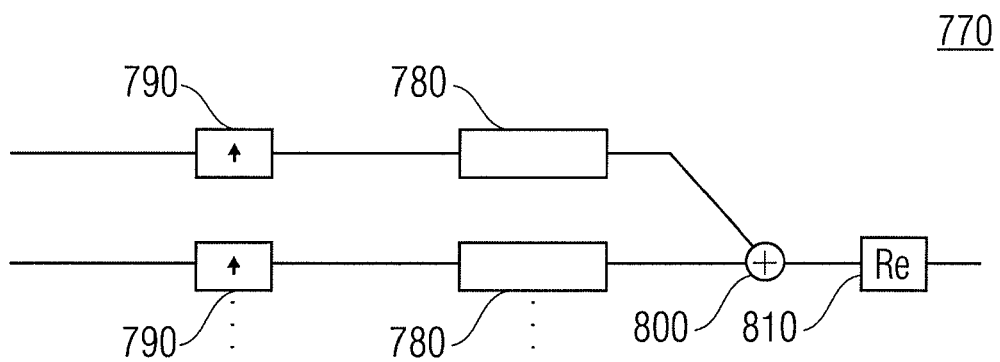
FIG. 11 illustrates a first possible solution of a (complex) synthesis filterbank.

FIG. 11 illustrates a possible solution for a complex synthesis bank 770. The complex synthesis bank 770 comprises L intermediate synthesis filters 780 to which L subband signals are provided to. Depending on the concrete implementation of the complex synthesis bank 770 prior to the filtering in the frame work of the intermediate synthesis filters 780, the subband signals are upsampled by L upsamplers 790, which reconstruct the sampled frequency of the subband signals by increasing the sampling frequency by a factor of L. In other words, the optional upsampler 790 reconstruct or reform the subband signals provided to the upsampler 790 in such a way that the information contained in each of the subband signals is retained while the sampling frequency is increased by a factor of L.

Nevertheless, as already explained in the context of FIG. 9, the upsamplers 790 are optional components, as the upsampling can also be carried out in the frame work of the intermediate synthesis filters 780. Hence, the step of upsampling the subband signals carried out by the upsampler 790 can be simultaneously processed in the framework of the intermediate synthesis filers 780. If, however, the downsamplers 740 are neither explicitly nor implicitly implemented, the upsamplers 790 do not have to be either implemented explicitly or implicitly.

The intermediate synthesis filters 780 are connected via an output to an adder 800 which sums up the filtered subband signals output by the L intermediate synthesis filters 780. The adder 800 is further connected to a real part extractor 810, which extracts or forms a real-valued signal or rather a (real-valued) time-domain output signal based on the complex-valued signal provided by the adder 800. The real part extractor 810 can perform this task for instance by extracting the real part of a complex-valued signal provided by the adder 810, by calculating the absolute value of the complex-valued signal provided by the adder 810 or by another method that forms a real-valued output signal based on a complex-valued input signal.

Figure 12:
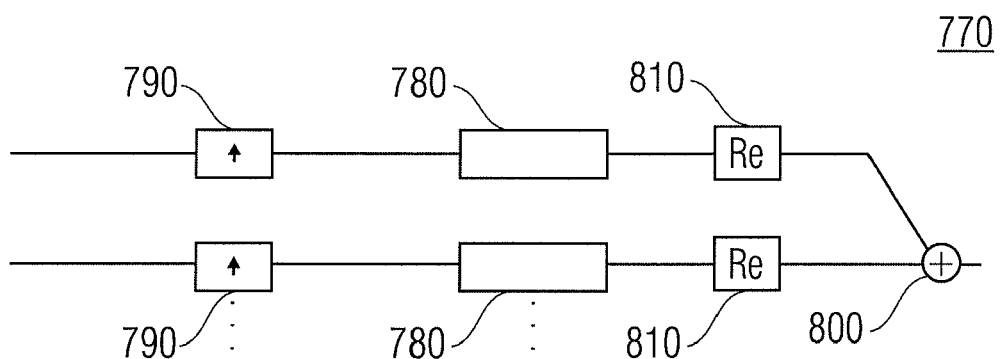
FIG. 12 illustrates a second possible solution for a (complex) synthesis filterbank.

The second possible solution for a complex synthesis bank 770 shown in FIG. 12 differs from the first possible solution shown in FIG. 11 only concerning the real part extractors 810 and the adder 800. To be more precise, the outputs of the intermediate synthesis filters 780 are connected separately from each subband to a real part extractor 810 extracting or forming a real-valued signal based on the complex-valued signal output by the intermediate synthesis filters 780. The real part extractors 810 are then connected to the adder 800, which sums up the L real-valued signals derived from the L filtered subband signals to form the real-valued output signal provided by the adder 800.

As explained earlier, FIG. 3 illustrates a possible selection of a filter converter 101. The filter is assumed to be given by its impulse response. Viewing this impulse response as a discrete time signal, it is analyzed by the L-band complex analysis (filter) bank 710. The resulting subband signal outputs are then exactly the impulse responses of filters to be applied separately in each subband in the subband filtering 705 shown in FIG. 10. In the case shown in FIG. 8, the filter definition signal provided to the filter converter 101 and its complex analysis bank or complex analysis filter bank 710 is the impulse response signal indicative of the amplitude/frequency characteristic of a filter, which is to be transferred into the subband domain. Hence, the output of the complex analysis (filter) bank 710 of each of the L subbands represents the impulse response of the intermediate filters comprised in the subband filtering 750.

The complex analysis bank 710 is in principle derived from an analysis bank for an audio output signal, but has a different prototype filter and a slightly different modulation structure, the details of which will be outlined in the following description. The length of the prototype filter $q(v)$ can be designed to be comparably small. Due to the downsampling by a factor L, the length of subband filters are also a factor of L smaller than the sum of the lengths of the given time-domain filter and the prototype filter $q(v)$.

In the present application, a non-vanishing tap or value is a tap or a value, which is ideally not equal to zero. Nevertheless, due to implementation restraints in the frame work of this application a non-vanishing value or tap is a real-valued or complex-valued tap or value with an absolute value which is larger than a predetermined threshold, e.g. $10^{-b}$ or $2^{-b}$, wherein b is a positive integer depending on the requirements of a concrete implementation. In digital systems this threshold is advantageously defined in the binary system (basis 2), wherein the integer b has a predetermined value depending on the specifics of the implementation. Typically, the value b is 4, 5, 6, 7, 8, 10, 12, 14, 16 or 32.

Complex Modulated Filter Banks

In the following, let $$Z(\omega) = \sum_{l=\infty}^{\infty} z(n)\exp(-il\omega)$$

be the discrete time Fourier transform of a discrete time signal $z(n)$. As before, n is an integer indicating an index or a time index of a time signal, while $\Omega=2\pi\cdot f$ is the circular frequency associated to the frequency f, $\pi$ is the circular number ($\pi$=3.1415926 ... ) and $i=j=\sqrt{-1}$ is the imaginary unit.

The complex exponential modulated L-band filterbank is defined from a real valued prototype filter $p(v)$ of finite length. For the computations below it will be assumed by extension with zeros that the prototype filter is defined for all integers n. Given a real valued discrete time signal $x(n)$ the analysis filter bank 710 applies, as already explained, the complex modulated prototype filters followed by downsampling by a factor L in order to output the subband signals, $$c_k(m) = \sum_{m=-\infty}^{\infty} x(n+mL)p(n)\exp\left(-i\frac{\pi}{L}\left(k+\frac{1}{2}\right)(v+\theta)\right), \quad (13)$$

for each subband index $k=0, 1, \ldots, (L-1)$, and integer time index m. In the following discussion, the time index m differs from the time index n with respect to the fact that m refers to the downsampled signals, whereas the integer n refers to signals with the full sample frequency.

Given complex valued subband signals $d_k(n)$, the synthesis filter bank 770 applies filtering followed by upsampling by a factor of L and a real value extraction in order to output the real valued signals, as already explained, to obtain the output signal $$y(n) = \mathrm{Re}\left\{\sum_{m=-\infty}^{\infty}\sum_{k=0}^{L-1} d_k(m)p(n-mL)\exp\left(i\frac{\pi}{L}\left(k+\frac{1}{2}\right)(n-mL+\psi)\right)\right\}. \quad (14)$$

In the equations (13) and (14) $\theta$ and $\psi$ represent (constant) phase factors for filtering the real-valued discrete time signal $x(n)$ into complex-valued subband signal and for reconstructing real-valued output samples $y(n)$ from complex valued subband signals $dk(m)$. It is well known that a prototype filter and fixed phase factors $\theta$ and $\psi$ can be chosen to give perfect reconstruction, $y(n)=x(n)$, in the case where $dk(m)=ck(m)$, that is when the subband signals are unaltered. In practice, the perfect reconstruction property will hold true up to a delay (and/or a sign change), but in the computations that follow, this detail will be ignored by allowing the use of an acausal prototype filter, as also explained in the case of the pseudo QMF type of design as in PCT/SE02/00626 "Aliasing reduction using complex exponential modulated filter banks". Here the prototype filter is symmetric $p(-n)=p(n)$, and its discrete time Fourier transform $P(\Omega)$ essentially vanishes outside the interval $|\Omega|\leq\pi/L$. The perfect reconstruction is also replaced by a near-perfect reconstruction property. For the derivation that follows it will be assumed for simplicity that both perfect reconstruction holds and that $P(\Omega)=0$ for $\pi/L<|\Omega|\leq\pi$. Moreover, the phase factors are assumed to satisfy the condition that $\psi-\theta$ is equal to an integer multiple of 4L.

In a critically sampled filter bank, the alteration of subband signals prior to synthesis usually leads to the introduction of aliasing artifacts. This is overcome here due to the fact that an oversampling by a factor two is introduced by using complex-valued signals. Although the total sampling rate of the subband samples is identical to the sampling rate of the discrete time input signal, the input signal is real valued and the subband samples are complex valued. As it will be outlined below, the absence of alias opens the door for efficient time invariant signal processing.

Subband Filtering in a Complex Modulated Filter Bank

Consider the modification of subband filtering 750 of each subband signal obtained by filtering the analysis samples $c_k(m)$ from the complex analysis bank 710 with a filter with impulse response $g_n(m)$ prior to the synthesis (12) performed by the complex synthesis (filter) bank 770

$$d_k(m) = \sum_l g_k(l) c_k(m-l). \tag{15}$$

Elementary computations show that given the assumptions on the frequency response of the prototype filter, the resulting effect on the reconstructed time signal is that of a discrete time filtering $$Y(\omega) = G(\omega) X(\omega), \tag{16}$$

where $$G(\omega) = \sum_{k=-L}^{L-1} G_k(L\omega) \left| P\left(\omega - \frac{\pi}{L}\left(k + \frac{1}{2}\right)\right) \right|^2. \tag{17}$$

Here, $G_k(\omega) = \Sigma_m(m) \exp(-im\omega)$ is the discrete time Fourier transform of the filter applied in subband k for $k \geq 0$ and $$G_k(\omega) = G_{-1-k}(-\omega)^* \text{ for } k<0 \tag{18}$$

where * denotes complex conjugation. Observe here that the special case $G_k(\omega)=1$ leads to $G(\omega)=1$ in (17) due to the assumed special design of the prototype $p(v)$, which implies $$\sum_{k=-L}^{L-1} \left| P\left(\omega - \frac{\pi}{L}\left(k + \frac{1}{2}\right)\right) \right|^2 = 1 \tag{19}$$

Another case of interest is $G_k(\omega)=\exp(-i\omega)$ which leads to $G(\omega)=\exp(iL\omega)$, so that $y(n)=x(n-L)$.

Approximating a Given Filter Response by Subband Filtering

Let $H(\omega)$ be a given filter (e.g. transfer function) with real-valued impulse response $h(n)$. This data is considered as input to the filter converter 101. In view of (17) and (19), a trivial choice for the subband filters which result in the desired response $G(\omega)=H(\omega)$ is given by $$G_k(\omega)=H(\omega/L), \text{ for } |\omega-\pi(k+\tfrac{1}{2})| \leq \pi, \tag{20}$$

The drawback of this formula is that although $H(\omega)$ is a smooth function of $\omega$, the periodized segment of it defined by (20) will exhibit jumps and the impulse response of the subband filters will be unnecessarily long. The disadvantageous usage of the complex pseudo QMF bank for equalization or envelope adjustment consists of applying a single gain $g_k$ in each subband, which results in the transfer function $$G(\omega) = \sum_{k=-L}^{L-1} g_k \left| P\left(\omega - \frac{\pi}{L}\left(k + \frac{1}{2}\right)\right) \right|^2 \tag{21}$$

with the extension $g_k=g^*_{-1-k}$ for $k<0$ defined in accordance with (18). In view of (19), one achieves $$G\left(\frac{\pi}{L}\left(k + \frac{1}{2}\right)\right) = g_k, \text{ for } k = 0, 1, \ldots, (L-1), \tag{22}$$

and the transfer function is interpolated between those frequencies. For target filter responses $H(\omega)$ that vary slowly as a function of the frequency $\omega$, a first method of approximating the filter is therefore obtained by choosing $$G_k(\omega) = H\left(\frac{\pi}{L}\left(k + \frac{1}{2}\right)\right). \tag{23}$$

A filter converter 101 is used to convert the filter (defined by its impulse response) $h(n)$ into intermediate subband filters 760 by means of the analysis filter bank 710 which employs real-valued prototype filter $q(n)$, $$g_k(m) = \sum_{n=-\infty}^{\infty} h(n+mL) q(n) \exp\left(-i\frac{\pi}{L}\left(k + \frac{1}{2}\right)n\right). \tag{24}$$

In terms of Fourier transforms this reads $$G_k(\omega) = \frac{1}{L} \sum_{l=0}^{L-1} H\left(\frac{\omega+2\pi l}{L}\right) Q\left(\frac{\omega+2\pi l}{L} - \frac{\pi}{L}\left(k + \frac{1}{2}\right)\right)^*. \tag{25}$$

The advantage of this procedure is that any given filter $h(n)$ can be efficiently transformed into intermediate subband filter responses. If $q(n)$ has $K_Q \cdot L$ taps, a time-domain filter $h(n)$ of $K_H \cdot L$ taps is converted into subband domain filters (24) with $(K_H+K_Q-1)$ taps, wherein $K_H$ and $K_Q$ are positive integers. In the case of $K_Q$ being equal to 3 ($L \cdot K_Q=192$) and with an impulse response of a time-domain filter corresponding to a length of $K_H \cdot 64$ (L=64), each intermediate subband filter 760 has an impulse response length of only $K_H+3-1=K_H+2$ taps.

Design of the Prototype Filter for the Filter Converter

Insertion of (25) into (17) yields $$G(\omega) = \sum_{l=0}^{L-1} H\left(\omega \frac{2\omega}{L} l\right) \tag{26}$$

$$\sum_{k=-L}^{L-1} \frac{1}{L} Q\left(\omega + \frac{2\pi}{L} l - \frac{\pi}{L}\left(k + \frac{1}{2}\right)\right)^* \left| P\left(\omega - \frac{\pi}{L}\left(k + \frac{1}{2}\right)\right) \right|^2.$$

Hence, the condition for $G(\omega)=H(\omega)$ to hold is that $$\sum_{k=-L}^{L-1} \frac{1}{L} Q\left(\omega + \frac{2\pi}{L} l - \frac{\pi}{L}\left(k + \frac{1}{2}\right)\right)^* \left| P\left(\omega - \frac{\pi}{L}\left(k + \frac{1}{2}\right)\right) \right|^2 = \delta[l], \tag{27}$$

where $\delta[l]=1$ for $l=0$ and $\delta[l]=0$ for $l \neq 0$. A simple solution to (27) is given by the brick wall filter $$Q(\omega) = \begin{cases} L, & \text{for } |\omega| \le \pi/L; \\ 0, & \text{for } \pi/L < |\omega| \le \pi \end{cases}$$

This prototype filter corresponds to the choice (20) and has the disadvantage of having an infinite and slowly decaying impulse response q(n). Instead, equation (17) is solved approximately (e.g. in the least-square sense) with a finite impulse response filter q(n). The time-domain equivalent of (27) is the system of linear equations for k=0, 1, . . . , L−1 and for all integers m, $$\sum_{v=-\infty}^{\infty} p_2(k+nL-2mL)q(k+nL) = \frac{1}{2L}\delta[k], \quad (28)$$

where $$p_2(n) = \sum_{l=-\infty}^{\infty} p(l)p(l+n) \quad (29)$$

is the autocorrelation of p(n). For any given support length the system of linear equations (28) can be solved in the least squares sense for a prototype filter q(n). It is desirable to use a support significantly shorter than that of the original filter bank prototype filter p(n), and in that case the linear system (28) is over-determined. A given quality of approximation can also be traded for other desirable properties via joint optimization. One example of such a property is a low pass type of frequency response Q(ω).

In the following the determination of a multi-slot QMF representation (subband domain) of the HRTF filters is described. The filter conversion from the time-domain into the complex QMF subband domain is performed by an FIR filter in the filter converter 101. To be more precise, the following description outlines a method for implementing a given FIR filter h(n) of length $N_H$ in the complex QMF subband domain.

The subband filtering itself is carried out by the intermediate filters 760 inside the subband filtering 750. To be more precise, the subband filtering consists of the separate application of one complex-valued FIR intermediate filter $g_k(l)$ for each QMF subband with an index k=0, 1, . . . , 63. In other words, in the following description special references will be made to the case of L=64 different subband signals. Nevertheless, this specific number of subband signals is not essential and the appropriate equations will also be given in a more general form.

The filter converter 101, which converts the given time-domain FIR filter h(n) into the complex subband domain filters $g_k(l)$ comprises the complex analysis bank 710. The prototype filter of the complex analysis filter bank 710 of the filter converter 101 q(n) of length 192 (=3·64) for the specific case of L=64 subband signals are created by solving in the least square sense the over determined system of the equation (28). The filter coefficients q(n) will be described in more detail for the case of L=64 subband signals later on.

To be more accurate in terms of mathematical description, an extension with zeros in the time-domain FIR filter is defined by $$\tilde{h}(n) = \begin{cases} h(n), & n = 0, 1 \ldots, N_H - 1, \\ 0, & \text{otherwise} \end{cases} \quad (30)$$

The resulting intermediate subband domain filters are based on equation (24) and can be expressed in the general case as $$g_k(l) = \sum_{n=0}^{N_q-1} \tilde{h}(n + L \cdot (l - l_0)) \cdot q(n) \cdot \exp\left(-i\frac{\pi}{L}\left(k + \frac{1}{2}\right)(n - n_0)\right). \quad (31)$$

wherein $l_0$ and $n_0$ are delays, l is an integer indicating an index of the filter taps and $N_q$ (=$N_Q$) is the length of the impulse response of the prototype filter q(n).

It should be noted, that in the frame work of the present application under an equation being based on an equation an introduction of additional delays (cf. $l_0$ and $n_0$) factors, additional coefficients and an introduction of a window function or another simple function is understood. Further, simple constants, constant addends etc., can be dropped. Moreover, algebraic transformations, equivalence transformations and approximations (e.g. a Taylor approximation) not changing the result of the equation at all or in a significant manner are also included. In other words, both slight modifications as well as transformations leading to essentially in terms of the result identical are included in the case that an equation or expression is based on an equation or expression.

In the case L=64, the expression for the subband domain filters or intermediate filters 760 becomes $$g_k(l) = \sum_{n=0}^{191} \tilde{h}(n + 64 \cdot (l - 2)) \cdot q(n) \cdot \exp\left(-i\frac{\pi}{64}\left(k + \frac{1}{2}\right)(n - 95)\right). \quad (32)$$

These subdomain filters have a length $L_Q=K_H+2$, where $$K_H = \lceil N_H/64 \rceil \quad (33)$$

and $N_H$ is the length of the impulse response h(n) of the filter characteristics to be transferred into the subband domain.

In this case, the integer k=0, 1, . . . , 63 is once again the index of a subband and l=0, 1, . . . , ($K_H$+1) is an integer indicating taps of the resulting intermediate filters 760.

The extra addend of (−2) in equation (32) as compared to equation (24) is there, because equation (24) was developed without any regard to casualty of filters. Real implementations will cause introduce delays. Hence, depending on the concrete implementation, additional delayers or delays can be implemented, which have been omitted for the sake of simplicity in the Figures.

In many cases the system of linear equations (28) is over determined. Nevertheless, it can be solved or approximated in the least square sense with respect to the prototype filter coefficients q(n). Solving the system of linear equations (28) in the least square sense, leads to the following filter taps of the prototype filter q(n) to fulfill the following relations for integers n from 0 to 191:

q[0] = −0.2029343380
q[1] = −0.1980331588
q[2] = −0.1929411519
q[3] = −0.1876744222
q[4] = −0.1822474011
q[5] = −0.1766730202
q[6] = −0.1709628636
q[7] = −0.1651273005
q[8] = −0.1591756024
q[9] = −0.1531160455

-continued q[10] = −0.1469560005
q[11] = −0.1407020132
q[12] = −0.1343598738
q[13] = −0.1279346790
q[14] = −0.1214308876
q[15] = −0.1148523686
q[16] = −0.1082024454
q[17] = −0.1014839341
q[18] = −0.0946991783
q[19] = −0.0878500799
q[20] = −0.0809381268
q[21] = −0.0739644174
q[22] = −0.0669296831
q[23] = −0.0598343081
q[24] = −0.0526783466
q[25] = −0.0454615388
q[26] = −0.0381833249
q[27] = −0.0308428572
q[28] = −0.0234390115
q[29] = −0.0159703957
q[30] = −0.0084353584
q[31] = −0.0008319956
q[32] = 0.0068418435
q[33] = 0.0145885527
q[34] = 0.0224107648
q[35] = 0.0303113495
q[36] = 0.0382934126
q[37] = 0.0463602959
q[38] = 0.0545155789
q[39] = 0.0627630810
q[40] = 0.0711068657
q[41] = 0.0795512453
q[42] = 0.0881007879
q[43] = 0.0967603259
q[44] = 0.1055349658
q[45] = 0.1144301000
q[46] = 0.1234514222
q[47] = 0.1326049434
q[48] = 0.1418970123
q[49] = 0.1513343370
q[50] = 0.1609240126
q[51] = 0.1706735517
q[52] = 0.1805909194
q[53] = 0.1906845753
q[54] = 0.2009635191
q[55] = 0.2114373458
q[56] = 0.2221163080
q[57] = 0.2330113868
q[58] = 0.2441343742
q[59] = 0.2554979664
q[60] = 0.2671158700
q[61] = 0.2790029236
q[62] = 0.2911752349
q[63] = 0.3036503350
q[64] = 0.9025275713
q[65] = 0.9103585196
q[66] = 0.9176977825
q[67] = 0.9245760683
q[68] = 0.9310214581
q[69] = 0.9370596739
q[70] = 0.9427143143
q[71] = 0.9480070606
q[72] = 0.9529578566
q[73] = 0.9575850672
q[74] = 0.9619056158
q[75] = 0.9659351065
q[76] = 0.9696879297
q[77] = 0.9731773547
q[78] = 0.9764156119
q[79] = 0.9794139640
q[80] = 0.9821827692
q[81] = 0.9847315377
q[82] = 0.9870689790
q[83] = 0.9892030462
q[84] = 0.9911409728
q[85] = 0.9928893067
q[86] = 0.9944539395
q[87] = 0.9958401318
q[88] = 0.9970525352
q[89] = 0.9980952118 q[90] = 0.9989716504
q[91] = 0.9996847806
q[92] = 1.0002369837
q[93] = 1.0006301028
q[94] = 1.0008654482
q[95] = 1.0009438063
q[96] = 1.0008654482
q[97] = 1.0006301028
q[98] = 1.0002369837
q[99] = 0.9996847806
q[100] = 0.9989716504
q[101] = 0.9980952118
q[102] = 0.9970525352
q[103] = 0.9958401318
q[104] = 0.9944539395
q[105] = 0.9928893067
q[106] = 0.9911409728
q[107] = 0.9892030462
q[108] = 0.9870689790
q[109] = 0.9847315377
q[110] = 0.9821827692
q[111] = 0.9794139640
q[112] = 0.9764156119
q[113] = 0.9731773547
q[114] = 0.9696879297
q[115] = 0.9659351065
q[116] = 0.9619056158
q[117] = 0.9575850672
q[118] = 0.9529578566
q[119] = 0.9480070606
q[120] = 0.9427143143
q[121] = 0.9370596739
q[122] = 0.9310214581
q[123] = 0.9245760683
q[124] = 0.9176977825
q[125] = 0.9103585196
q[126] = 0.9025275713
q[127] = 0.8941712974
q[128] = 0.2911752349
q[129] = 0.2790029236
q[130] = 0.2671158700
q[131] = 0.2554979664
q[132] = 0.2441343742
q[133] = 0.2330113868
q[134] = 0.2221163080
q[135] = 0.2114373458
q[136] = 0.2009635191
q[137] = 0.1906845753
q[138] = 0.1805909194
q[139] = 0.1706735517
q[140] = 0.1609240126
q[141] = 0.1513343370
q[142] = 0.1418970123
q[143] = 0.1326049434
q[144] = 0.1234514222
q[145] = 0.1144301000
q[146] = 0.1055349658
q[147] = 0.0967603259
q[148] = 0.0881007879
q[149] = 0.0795512453
q[150] = 0.0711068657
q[151] = 0.0627630810
q[152] = 0.0545155789
q[153] = 0.0463602959
q[154] = 0.0382934126
q[155] = 0.0303113495
q[156] = 0.0224107648
q[157] = 0.0145885527
q[158] = 0.0068418435
q[159] = −0.0008319956
q[160] = −0.0084353584
q[161] = −0.0159703957
q[162] = −0.0234390115
q[163] = −0.0308428572
q[164] = −0.0381833249
q[165] = −0.0454615388
q[166] = −0.0526783466
q[167] = −0.0598343081
q[168] = −0.0669296831
q[169] = −0.0739644174

-continued

```
q[170] = −0.0809381268
q[171] = −0.0878500799
q[172] = −0.0946991783
q[173] = −0.1014839341
q[174] = −0.1082024454
q[175] = −0.1148523686
q[176] = −0.1214308876
q[177] = −0.1279346790
q[178] = −0.1343598738
q[179] = −0.1407020132
q[180] = −0.1469560005
q[181] = −0.1531160455
q[182] = −0.1591756024
q[183] = −0.1651273005
q[184] = −0.1709628636
q[185] = −0.1766730202
q[186] = −0.1822474011
q[187] = −0.1876744222
q[188] = −0.1929411519
q[189] = −0.1980331588
q[190] = −0.2029343380
q[191] = −0.2076267137
```

Figure 13:
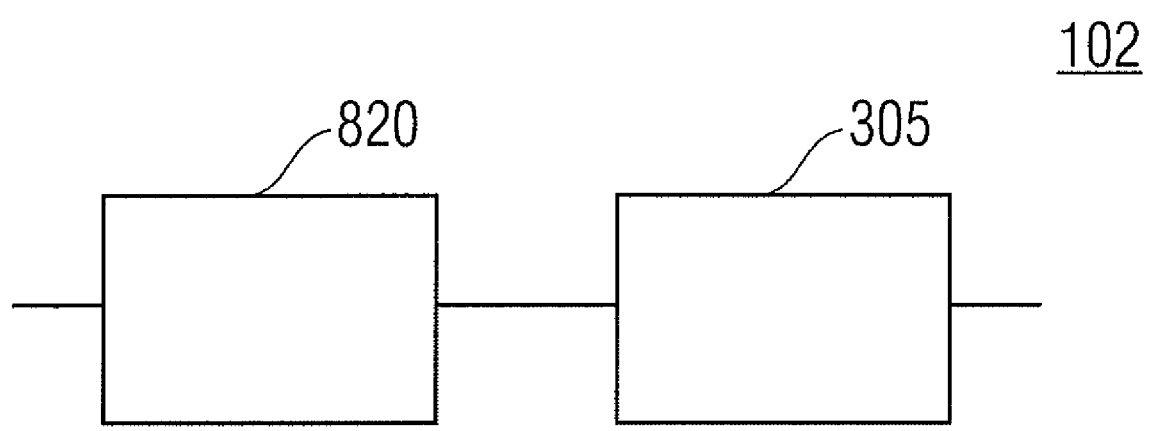
FIG. 13 illustrates a further embodiment of a filter compressor according to the present invention.

FIG. 13 shows a simplified block diagram of an embodiment of a filter compressor 102 comprising a processor 820 and a filter impulse response constructor 305 which are connected in series between an input and an output of the embodiment of the filter compressor 102. The embodiment of a filter compressor 102 receives at the input, a set of input subband filter impulse responses, having filter impulse response values at filter taps, which are provided to the processor 820. The processor 820 examines the filter impulse response values from at least two of the input subband filter impulse responses and is capable of selecting filter impulse response values having a higher absolute value, as explained in the context of FIG. 4 and especially in the context of the absolute value representation module 303 and the whitening module 402, in particular, along with a mask generator 304. Moreover, the processor 820 is capable of not selecting at least one filter impulse response value, having a lower absolute value compared to at least one selected filter impulse response.

In other words, the processor 820 of the embodiment shown in FIG. 13 comprises the functionality of the absolute value representation module 303 and the mask generator 304. The filter impulse response constructor, or rather the filter calculator module 305 is capable of constructing compressed subband filter impulse responses using the selected filter impulse response values, wherein the compressed subband filter impulse responses do not include filter impulse response values or zero-valued values corresponding to filter taps of not selected filter impulse response values. As explained earlier on, it should be noted that the filter impulse response filter 305 can be adapted to setting not selected impulse response values to zero or constructing the compressed subband filter impulse responses by copying only the selected impulse response values or by some other means of disregarding the not selected filter impulse response values.

As a consequence, the embodiment of the filter compressor 102, as shown in FIG. 13, is capable of carrying out an embodiment of an inventive method of manufacturing compressed subband filter impulse responses from inputs in subband filter impulse responses having filter impulse response values at filter taps. In the context of compressed subband filter impulse responses, manufacturing same can equally be understood as generating or providing the compressed subband filter impulse responses to as system or a computer-readable storage medium.

Figure 14A:
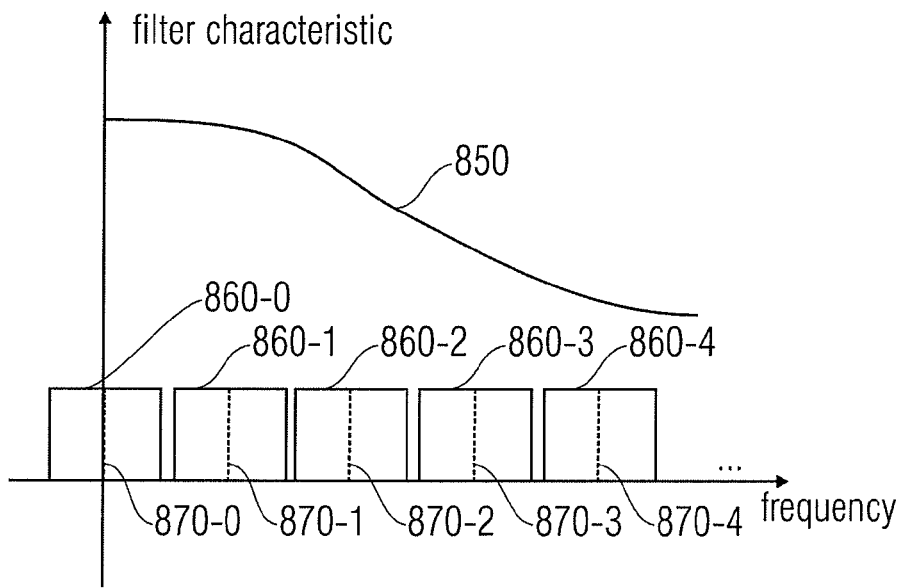
FIGS. 14a to 14c illustrate a spectral whitening as employed in an embodiment of a filter compressor according to the present invention.

As indicated in the context of the discussion of the whitening module 402 in FIG. 4, the described methods of whitening or weighing the evaluation representation A(n,k) or rather the absolute value representation $A^v(n,k)$, which can be carried out according to equation (4) will be explained in more detail in the context of FIG. 14. Accordingly, FIG. 14a shows a schematic representation of an exemplary filter characteristic 850, as a function of the frequency of the filter in the time-domain. Moreover, FIG. 14a shows schematically the arrangement of the corresponding frequency bands 860-0, . . . , 860-4, which corresponds to the subbands with indices k=0, . . . , 4. Each of these frequency bands 860 (using summarizing reference signs as indicated earlier) corresponding to one of the subbands with the respective subband index k can furthermore be characterized in terms of a center frequency, which is indicated in FIG. 14a as a dashed line 870-0, . . . , 870-4. The center frequency, as well as the frequency bands of the respective subbands are determined by the inner structure of the complex modulated filterbanks employed in the filter converter 101. To be more precise, the prototype filter q(n) along with the center frequency depending on the subband index k, as can for instance be seen in the case of equation (14), determines the corresponding frequency bands of the respect subband. If, for instance, the prototype filter of the corresponding complex modulated filterbank p(n) or q(n) is a low-pass filter for the subband with the index k=0, due to the complex modulation as expressed by the exponential function in equation (14), will be transferred into band-pass filter for higher subband indices k≧1.

Figure 14B:
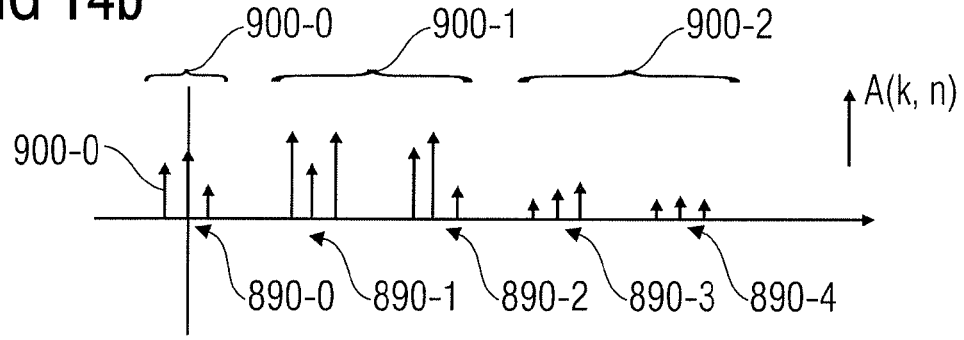

FIG. 14b shows a schematic representation of the input subband filter impulse responses as provided, for instance by the filter converter 101. To be more precise, FIG. 14b shows schematically which indicates the evaluation representation A(k,n) for the different subbands, indicated as a set of arrows 880. For reasons of simplicity only, for each subband a set of three arrows 880 is shown in FIG. 14b for each of the subbands 890-0, . . . , 890-4. As indicated by the braced brackets 900-0, . . . , 900-2, the five subbands 890-0, . . . , 890-4 are arranged into three subgroups of subbands 900-0, 900-1, 900-2, wherein the first subgroup 900-0 comprises only the first subband 890-0 (k=0), while the second and the third subgroups 900-1, 900-2, each comprises two, in terms of the center frequencies neighboring subbands 890-1 and 890-2, as well as 890-3 and 890-4.

Figure 14C:
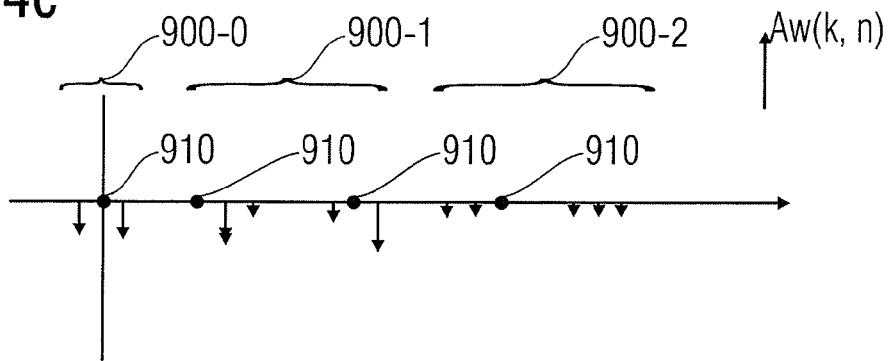

According to the whitening or spectral whitening carried out in the framework of the whitening module 402 shown in FIG. 4, according to equation (4) with respect to each of the subgroups of subbands 900, the maximum value of the evaluation representation is determined, and will be subtracted afterwards from each of the evaluation representation values to obtain the whitened evaluation representation $A_W(k,n)$, as shown in FIG. 14c. As a consequence of subtracting the maximum value of the evaluation representation, for each of the subgroups 900, the maximum contribution of the evaluation representation will be set to zero, as indicated in FIG. 14c by the dots 910.

Due to the determination of the maximum value for each of the subgroups 900 according to equation (4), each of the subgroups of subbands 900 comprises at least one whitened evaluation representation value having the value of zero, wherein the rest of the whitened evaluation representation values $A_W(k,n)$ is smaller than or equal to zero. As a consequence, in each of the subgroups 900 at least one value is set to zero and thereby represents a maximum value so that each of the subgroups of subbands, which were determined according to a psycho-acoustic model in some of the embodiments, in the course of the compression at least one filter impulse response value of each of the subgroups 900 is retained.

Thereby, in the course of the spectral whitening as described by equation (4), spectral weight or spectral energy is transferred from the subbands having a lower central frequency to subbands having higher frequencies by applying the whitening scheme. A direct comparison of FIGS. 14b and 14c also underlines this. While in FIG. 14b the evaluation representation values in the subgroup 900-2 are significantly smaller than those of the subgroup 900-1, after applying the whitening procedure, the resulting whitened evaluation representation values in the subgroups 900-2 are significantly larger as compared to at least some of the values of the evaluation representation of the subgroup 900-1. It should be noted in this context that the subgroup 900-1 comprises two zero-valued evaluation representation values as indicated by the dots 910, which is caused by the fact that evaluation representations A(k,n) as shown in FIG. 14b of the subgroup comprises two identical maximum values. This, however, is not a violation of an application of equation (4). Equation (4) only ensures that at least one value of the evaluation representation of each subgroup is set to zero and thereby represents the maximum value in the context of the whitened evaluation representation $A_W(k,n)$.

FIG. 15 shows a further embodiment of a filter compressor 501, which is capable of processing more than one input subband filter impulse response $H^v(n,k)$. The structure of the filter compressor shown in FIG. 15 is very similar to the one shown in FIG. 5 and differs from that embodiment only with respect to the fact that the absolute value representation modules 303 each comprise an absolute value and logarithmic function module 401 and a whitening module 402, which is also shown and explained in the context of FIG. 4. Moreover, the filter calculation module or filter impulse response constructor 305 comprises, each a filter decimator module 403, as well as a gain calculator 404 which can be implemented as an optional component in the context of FIG. 4.

The embodiment shown in FIG. 15 differs from the embodiment shown in FIG. 5 furthermore with respect the mask generator 502 for multiple filters. To be more precise, the mask generator 502 of FIG. 15 comprises an average calculating module 920, which can for instance, implement calculating the joint absolute value representation A(n,k) on the basis of the individual (optionally whitened) absolute value representation $A^v(n,k)$ according to equation (9). To be even more precise, in the framework of equation (9) the individual absolute value representations or evaluation representations for each of the filters $A^v(n,k)$ for the filters $v=0, \ldots, (N-1)$ should be replaced by the appropriate whitened evaluation representations $A_W^v(n,k)$, as these whitened evaluation representation values are provided by the whitening modules 402 to the average calculating module 920. In an embodiment of the filter compressor 501, as for instance shown in FIG. 15, the individual filter impulse response constructor 305 for the different filters $v=0, \ldots, (N-1)$, wherein N is the number of filters provided to the embodiment 501, can be implemented as a single (overall) filter impulse response constructor 305' as indicated in FIG. 15 by the dashed line. To be more precise, depending on the concrete implementation and the technical circumstances, it may be advisable to implement a single filter impulse response constructor 305' rather than N individual filter impulse response constructors 305. This may for instance be the case, when computational power, at least in the framework of the filter impulse response constructors, is not an essential design goal or requirement. In other words, also the embodiment 501 shown in FIG. 15 can be regarded as the embodiment in which the processor 820 and the filter impulse response constructor 305' are connected in the series between an input and an output of the respective filter compressor 501.

Moreover, it should be noted that with respect to embodiments of the methods and the methods carried out by the embodiments of the filter compressors 102, 501, the FIGS. 1 to 6, 13 and 15 can also be considered as flow charts of the respective methods, wherein the "direction of the flow" is comprised in the direction of the signals. In other words, the figures mentioned above do not only reflect different embodiments of filter compressors 102, 501, but do also illustrate both, the methods carried out by these embodiments as well as embodiments of the methods for generating compressed subband filter impulse responses themselves.

Hence, embodiments of the present invention relate to a filter compressor in the subband domain which is sometimes also referred to as the QMF (QMF=Quadrature Mirror Filterbank), which can for instance be employed in the field of audio applications such as filtering of head related transfer functions (HRTF) for a multi-channel sound experience over headphones.

The present invention relates to the problem of computational complexity of using long filters in the QMF domain. The invention teaches new ways to reduce the computation that may be performed when applying the filtering in the QMF domain by selecting the most relevant filter coefficients in a time-frequency representation of one or more filters, creating a filter-mask indicating the most relevant filter coefficients, and ignoring the coefficients not covered by the filter mask.

However, in embodiments of a filter compressor 501, the processor 820 is not required to consider all filters provided to the filter compressor 501 when examining and selecting filter impulse response values for the compressed filter impulse responses output by the filter compressor. However, embodiments of a filter compressor can in this case be adapted to constructing also a compressed filter impulse response or more than one compressed filter impulse responses for one or more input filter impulse responses, which have not been taken into consideration in the framework of examining and selecting filter impulse response values. This may, for instance, be advisable in the case of one or more filters being perceptually not that important so that to reduce the computational complexity further, these filters are not required to be taken into consideration when examining and selecting the filter impulse response values. This may for instance, be implemented if one or more filters do not have a significant amount of energy or volume. In these cases, distortions introduced by not examining and not selecting the filter impulse response values based on these filters may be acceptable depending on the special circumstances of these filters.

Some embodiments of the present invention comprise the following features:

Converting the time-domain filter or several filters to a complex QMF filter representation;

Creating an absolute valued time/frequency representation of the filter in the QMF domain;

Applying a spectral whitening of the absolute valued representation;

Creating a filter mask indicating the desired filter coefficients given the absolute valued time/frequency representation of one or more filters;

Creating new complex QMF filters containing the coefficients indicated by the filter mask;

Adjusting the gain of the new filter or filters to obtain the same gain of the new filters as the original filters.

An embodiments of an apparatus for recalculating complex QMF domain representation of filters is capable of carrying out:

transforming the time-domain filter to a QMF domain representation;

creating a filter representation of the QMF representation of the filter;

creating a filter mask based on the representation of the QMF domain representation of the filter; and creating a new QMF filter based on the first QMF filter and the filter mask.

Some embodiments of the present invention may solve the problem of high computational complexity of filtering long filters. They introduce a filter compressor operating in the complex QMF domain. Some embodiments of the present invention therefore may offer a reduction of the computational complexity of filtering. Embodiments of the present invention can, for instance, be implemented as a filter compressor, a method for manufacturing compressed subband filter impulse responses, a computer-readable storage medium or as a computer program.

An embodiment of a filter compressor 102, 501 offers the opportunity to improve the overall sound quality significantly, although the features of many audio-related impulse responses is to have a rather sparse time/frequency signature. Often longer contribution are only present for low frequencies and the effective time duration is much shorter than the nominal filter length for higher frequencies. Embodiments of the present invention, for instance in the form of filter compressors, are capable of exploiting these features.

Furthermore, it should be noted that the compressed subband filter impulse responses, as provided by an embodiment of a filter compressor, can be stored on a computer-readable storage medium having stored thereon a set of or a plurality of subband filter impulse responses, which together approximate or represent a time-domain HRTF filter. Compared to a respective set of HRTF-related filter impulse responses in the complex QMF domain, the plurality of compressed subband filter impulse responses stored on the computer-readable storage medium, typically have a shorter impulse response, which can be realized whether by having a lower number of respective impulse response values, by a reduced number of non-trivial or non-zero filter taps or a combination of both.

If, for instance, the corresponding HRTF filter functions comprise $K_H$ filter taps in the time-domain, and the compressed subband filter impulse responses stored on the computer-readable storage medium are intended to be used in a subsystem with L subbands, the shorter impulse responses typically comprise less than $(K_H/L)$ at least in terms of one subband filter impulse response. Advantageously, at least one subband filter impulse response comprises even less than $(K_H/L-3)$ non-trivial or non-zero filter taps.

Moreover, if on the computer-readable storage medium more than a plurality of sets of subband filter impulse responses corresponding to compressed time-domain HRTF filters are stored, the corresponding sets of compressed subband filter impulse responses comprise a common data pattern, wherein the common data pattern indicates impulse response values, which indicate in at least some of the set of subband filter impulse responses stored on the computer-readable storage medium, impulse response values having a trivial value or which are missing. In other words, the common data pattern relates to not selected filter impulse response values in more than one set of filter impulse responses, which have not been used by a filter impulse response constructor as part of an embodiment of a filter compressor. Such a (similar) data pattern can, for instance be caused by a common filter mask M(n,k) as provided by a mask generator 502 for multiple input filters H˜(n,k).

In yet other words, a computer-readable storage medium may comprise not only a single set of (compressed) subband filter impulse responses for different subbands, but a plurality of filter impulse responses. Each of these sets of filter impulse responses may comprise a common data pattern, when being looked at as a whole, which is given either by a corresponding impulse response value being zero-valued or missing at all. Each of these sets of filter impulse responses comprises the same, common data pattern which are stored on the computer-readable storage medium. For instance, if in one set of filter impulse response values a specific value indicated by the time or sample index n and the subband index k is either missing or zero-valued, the impulse response values identified by the same sample or time index n and the same subband index k of other sets of subband impulse responses are also missing, zero-valued or having another predefined value. In this context the different sets of filter impulse responses are identified or labeled by the respective indices v, wherein the index v may for instance acquire any of the integer values in the range from 0 to (N−1), wherein N is once again the number of filters.

In other words, the data pattern described above refers to filter impulse response values, which may, for instance, not be selected in the sense described in the context of the embodiments of a filter compressor 501. Hence, the data pattern is recognizable or can be defined in terms of indices (n,k) referring to sample or time indices n and subband indices k of different sets of filter impulse responses identified by the respective filter index v being all set to zero or being all missing.

The computer-readable storage medium may for instance comprise HRTF-related filters. Moreover, a plurality of sets of subband filter impulse responses stored on the computer-readable storage medium can be a set of filter impulse responses for a spatial audio system.

It is important to note that a computer-readable storage medium can in principle be any computer-readable storage medium. Examples for such a computer-readable storage medium are carriable storage media such as a floppy disc, a CD, a CD-ROM, a DVD or any other storage medium, which is capable of storing information in a computer-readable manner. Moreover, also built in memories such as a RAM (random access memory), ROM (read only memory), hard disc memories, NVM (non-volatile memory) or flash-memories can be used. In other words, a computer-readable storage medium in the sense of the present application is not only a carriable storage medium, but also a built-in storage medium. Moreover, the term computer-readable storage medium also refers to such media in which the data or information can be altered or changed as well as those memories, in which the respective data information cannot be changed.

Hence, according to a embodiment of the present invention, a computer-readable storage medium may have stored thereon a plurality of subband filter impulse responses, together approximating a time-domain head related transfer function, wherein the plurality of subband filter impulse filter responses have shorter impulse response as compared to the time-domain head related transfer function.

Depending on certain implementation requirements of embodiments of the inventive method, embodiments of the inventive method can be implemented in hardware or in software. The implementation can be performed using a digital storage medium, a computer-readable storage medium, for instance, a disc, CD or a DVD having an electronically readable control signal stored thereon, which cooperates with a processor, such than an embodiment of the inventive method is performed. Generally, an embodiment of the present invention is, therefore, a computer program product with a program code stored on the machine-readable carrier, the program code being operative for performing an embodiment of an inventive method, when the computer program runs on a processor. In other words, embodiments of the inventive methods are, therefore, a computer program having a program code for performing at least one embodiment of the inventive methods, when the computer program runs on a computer. A processor, can in this context, be formed by a programmable computer system, a programmable computer, a central processing unit (CPU), an application specific integrated circuit (ASIC), a processor or another integrated circuit (IC).

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A filter compressor for generating compressed subband filter impulse responses from input subband filter impulse responses corresponding to subbands, which comprise filter impulse response values at filter taps, comprising:
   a processor for examining the filter impulse response values from at least two input subband filter impulse responses to find filter impulse response values comprising higher values, and at least one filter impulse response value comprising a value being lower than the higher values; and
   a filter impulse response constructor for constructing the compressed subband filter impulse responses using the filter impulse response values comprising the higher values, wherein the filter impulse response constructor is configured to construct the compressed subband filter impulse responses so that the compressed subband filter impulse responses
      do not comprise filter impulse response values corresponding to filter taps of the at least one filter impulse response value comprising the lower value; or
      comprise zero-valued filter impulse response values corresponding to filter taps of the at least one filter impulse response value comprising the lower value.

2. The filter compressor according to claim 1, wherein the processor for examining the filter impulse response values is adapted to processing complex-valued filter impulse response values, and wherein the filter impulse response constructor is adapted to processing complex-valued impulse response values.

3. The filter compressor according to claim 1, wherein the processor is adapted to examining and the filter impulse response values based on an absolute value, such that the higher values are higher absolute values and the lower value is a lower absolute value.

4. The filter compressor according to claim 2, wherein the processor is adapted to examining the filter impulse response values based on an absolute value, a real part, an absolute value of the real part, an imaginary part, an absolute value of the imaginary part or a phase of the complex values of the filter impulse response values.

5. The filter compressor according to claim 1, wherein the processor is adapted to calculating an evaluation representation based on the filter impulse response values of the input filter responses.

6. The filter compressor according to claim 5, wherein the processor is adapted to calculating the evaluation representation based on a psycho-acoustic model, or a model based on a characteristic of a human ear.

7. The filter compressor according to claim 5, wherein the processor is adapted to calculating absolute values based on the filter impulse response values to achieve the evaluation representation.

8. The filter compressor according to claim 5, wherein the processor is adapted to calculating logarithmic values based upon the filter impulse response values to achieve the evaluation representation.

9. The filter compressor according to claim 5, wherein the processor is adapted to calculating the evaluation representation $A(n,k)$ based on the equation $$A(n,k) = 20 \log_{10} |H(n,k)|,$$

wherein $H(n,k)$ are the filter impulse response values, wherein n is an integer indicating a sample or a time index, and wherein k is an integer indicating an index of the subband of the at least two impulse subband filter impulse responses.

10. The filter compressor according to claim 3, wherein the processor is adapted to calculating the evaluation representation $A(n,k)$ based on the equation $$A(n,k) = |H(n,k)|^s,$$

wherein n is an integer indicating a sample or time index, wherein k is an integer indicating an index of the subbands of the at least two input subband filter impulse responses, and wherein s is a non-zero-valued real number.

11. The filter compressor according to claim 5, wherein the processor is adapted to weighing the evaluation representation based on a psycho-acoustic model based on the center frequencies of the subbands corresponding to the input subband filter impulse responses to achieve a whitened evaluation representation.

12. The filter compressor according to claim 5, wherein the processor is adapted to weighing the evaluation representation based on at least one subgroup of subbands, wherein each subband belongs at most to one subgroup of subbands.

13. The filter compressor according to claim 12, wherein the processor is adapted to weighing the evaluation representation based on at least one subgroup of subbands, wherein each subgroup of subbands comprises at least one subband and each subband belongs to exactly one subgroup of subbands.

14. The filter compressor according to claim 12, wherein the processor is adapted to weighing the evaluation representation based on at least one subgroup of subbands, wherein each subgroup comprising at least two subbands comprises only subbands with neighboring center frequencies with respect to a set of center frequencies of all subbands ordered according to the respective center frequencies of the subbands.

15. The filter compressor according to claim 5, wherein the processor is adapted to weighing the evaluation representation to achieve a whitened evaluation representation such that each subband or each subgroup of subbands comprises at least one value of the whitened evaluation representation corresponding to one impulse response value and comprising a predetermined, adaptable, programmable or fixed value.

16. The filter compressor according to claim 5, wherein the processor is adapted to weighing the evaluation representation for each subband individually.

17. The filter compressor according to claim 5, wherein the processor is adapted to weighing the evaluation representation such that the weighing comprises determining a maximum value for each subgroup of subbands or for each subband and subtracting the determined maximum value from each value of the evaluation representation for the respective subgroup of subbands or for the respective subbands.

18. The filter compressor according to claim 5, wherein the processor is adapted to weighing the evaluation representation $A(n,k)$ to achieve the whitened evaluation representation $A_w(n,k)$ based on the equation $$A_W(n,k)=A(n,k)-\max_{l\in I(p)}\max_n A(n,l), k\in I(p),$$

wherein n is an integer indicating a sample or time index, wherein k and l are integers indicating indices of the subbands of the at least two input subband filter impulse responses, wherein p is an integer indicating a subgroup of subbands, and wherein I(p) is a set of subband indices comprised in the subgroup of subbands indicated by the integer p.

19. The filter compressor according to claim 5, wherein the processor is adapted to weighing the evaluation representation such that the weighing comprises determining a maximum value for each subgroup of subbands or for each subband and dividing each value of the evaluation representation of the respective subgroup of subbands or of the respective subband by the determined maximum value or a value derived thereof for the respective subgroup of subbands or by the determined maximum value for the respective subband.

20. The filter compressor according to claim 1, wherein the processor is adapted to finding at least one filter impulse response value of each subband or at least one filter impulse response value of each subgroup of subbands comprising a higher value irrespective of the absolute value of the impulse response values of the subbands or the subgroup of subbands.

21. The filter compressor according to claim 5, wherein the processor is adapted to finding the filter impulse response values based on the evaluation representation.

22. The filter compressor according to claim 1, wherein the processor is adapted to examining the filter impulse response values such that with respect to at least one subband or with respect to at least one subgroup of subbands less than 50% of the overall number of respective filter impulse response values comprise values lower than the higher values.

23. The filter compressor according to claim 1, wherein the processor is adapted to finding filter impulse response values such that with respect to at least one subband a number of impulse response values comprising a value lower than the higher values, which is smaller than $K_Q$, wherein the number of filter impulse response values of a filter in the time-domain corresponding to the input subband filter impulse responses is at least $K_Q \cdot L$, wherein L is the number of subbands, and wherein $K_Q$ and L are positive integers.

24. The filter compressor according to claim 23, wherein the processor is adapted to examining the filter impulse response values such that with respect to the at least one subband the number of filter impulse response values is equal to or less than $(K_Q -3)$.

25. The filter compressor according to claim 5, wherein the processor is adapted to examining the filter impulse response value such that based on the evaluation representation or the whitened evaluation representation a predetermined, adjustable, fixed or programmable number of impulse response values comprise the higher values.

26. The filter compressor according to claim 25, wherein the processor is adapted such that the predetermined, adjustable, fixed or programmable number is larger than or equal to the number of subbands or equal to or greater than the number of subgroups of subbands.

27. The filter compressor according to claim 1, wherein the processor is adapted to finding a filter impulse response value being smaller than the higher values, when the filter impulse response values, the corresponding value of the evaluation representation or the corresponding value of the whitened evaluation representation is below a threshold.

28. The filter compressor according to claim 1, wherein the processor is adapted to finding at least one filter impulse response value being lower than the higher values, when the value of the filter impulse response value is close to an aliasing level of a filter bank corresponding to the input subband filter impulse response.

29. The filter compressor according to claim 1, wherein the processor is adapted to providing a mask $M(n,k)$ indicating the impulse response values comprising the higher values, wherein n is an integer indicating a sample or time index, and wherein k is an integer indicating an index of the subbands of the at least two input subband filter impulse responses.

30. The filter compressor according to claim 29, wherein the processor is adapted to providing the mask $M(n,k)$ comprising a binary value indicating if the impulse response value indicated by the integers n,k comprises a higher value or comprises a value being lower than the higher values.

31. The filter compressor according to claim 1, wherein the processor is adapted such that examining the filter impulse response values comprises selecting the filter impulse responses comprising the higher values.

32. The filter compressor according to claim 1, wherein the filter impulse response constructor is adapted to constructing the compressed subband filter impulse responses using the filter impulse response values comprising a higher value by providing the respective subband filter impulse response values or values based thereon as the compressed subband filter impulse response values; and by at least one of
  setting the impulse response values comprising a value being lower than the higher values to zero;
  disregarding the impulse response values comprising a value lower than the higher values; and
  providing a real-valued value based on a complex-valued filter impulse response value comprising a lower value than the higher values, when the filter impulse response value is complex-valued.

33. The filter compressor according to claim 1, wherein the filter impulse response constructor is adapted to constructing the compressed subband filter impulse responses using the filter impulse response values comprising a higher value by at least one of taking and copying the respective impulse response values.

34. The filter compressor according to claim 29, wherein the filter impulse response constructor is adapted to constructing the compressed subband filter impulse responses $H_M(n,k)$ based on the equation $$H_M(n,k)=M(n,k)\cdot H(n,k),$$

wherein $H(n,k)$ are filter impulse response values, $M(n,k)$ is a mask provided by the processor indicating the filter impulse response values comprising a higher value or a value being lower than the higher values, wherein the mask comprises the value 0 for a filter impulse response value comprising a lower value than the higher values, wherein n is an integer indicating a sample or time index and wherein k is an integer indicating an index of the subbands of the at least two input subband filter impulse responses.

35. The filter compressor according to claim 1, wherein the filter impulse response constructor is adapted to adjusting at least one filter impulse response value of a compressed subband filter impulse response such that the at least one adjusted filter impulse response value comprises a larger absolute value compared to the absolute value of the corresponding filter impulse response value.

36. The filter compressor according to claim 1, wherein the filter impulse response constructor is adapted to adjusting the impulse response values comprising a higher value by multiplying the respective impulse response values with a subband-specific gain factor depending on the respective subband.

37. The filter compressor according to claim 1, wherein the filter impulse constructor is adapted to adjusting the impulse response values comprising a higher value by multiplying the respective impulse response values with a subgroup-specific gain factor depending on the respective subgroup of subbands.

38. The filter compressor according to claim 1, wherein the filter impulse constructor is adapted to adjusting the impulse response values comprising one of the higher values by multiplying the respective impulse response values $H_M(n,k)$ with a subband-specific gain factor $G(k)$ based on the equation $$G(k) = \min\left\{G_{max}, \left(\frac{\sum_n |H(n,k)|^2}{\varepsilon + \sum_n |H_M(n,k)|^2}\right)^{1/2}\right\}$$

to achieve the compressed subband filter impulse responses $\hat{H}(n,k)$ based on the equation $$\hat{H}(n,k) = G(k)H_M(n,k),$$

wherein $H(n,k)$ are the filter impulse response values, wherein n is an integer indicating a sample or time index, wherein k is an integer indicating an index of the subbands of the at least two input subband filter impulse responses, wherein $G_{max}$ is a positive real-valued number indicating a maximum gain factor, wherein $\varepsilon$ is a positive real-valued real number.

39. The filter compressor according to claim 1, wherein the filter impulse constructor is adapted to adjusting the filter impulse response values comprising a higher value by multiplying the respective impulse response values $H_M(n,k)$ with a subband-specific gain factor $G(p)$ based on the equation $$G(p) = \min\left\{G_{max}, \left(\frac{\sum_n \sum_{k\in I(p)} |H(n,k)|^2}{\varepsilon + \sum_n \sum_{k\in I(p)} |H_M(n,k)|^2}\right)^{1/2}\right\},$$

wherein $H(n,k)$ are the filter impulse response values, wherein n is an integer indicating a sample or time index, wherein k is an integer indicating an index of the subbands of the at least two input subband filter impulse responses, wherein $G_{max}$ is a positive real-valued number indicating a maximum gain factor, wherein $\varepsilon$ is a positive real-valued number, to achieve the compressed subband filter impulse responses $\hat{H}(n,k)$ based on the equation $$\hat{H}(n,k) = G(p)H_M(n,k), k\in I(p),$$

wherein p is an integer indicating an index of a subgroup of subbands, wherein $I(p)$ is a set of indices of subbands comprised in the subgroup of subbands indicated by the index p.

40. The filter compressor according to claim 1, wherein the filter impulse constructor is adapted to constructing the compressed subband filter impulse response values by providing a real-valued value based on a complex-valued filter impulse response value as the corresponding compressed subband filter impulse response value, when the complex-valued input filter response value corresponds to a center frequency above a border frequency.

41. The filter compressor according to claim 40, wherein the filter impulse constructor is adapted such that the real-valued value based on the complex-valued filter impulse response value is at least one of a real part, an imaginary part, an absolute value, a phase, a linear combination based thereon, a polynomial expression based thereon and a real-valued expression based thereon.

42. The filter compressor according to claim 40, wherein the filter impulse constructor is adapted to providing the real-valued value by replacing the complex-valued input filter response value with the real-valued value.

43. The filter compressor according to claim 40, wherein the filter impulse constructor is adapted such that the border frequency is in the range of 1 kHz and 10 kHz.

44. The filter compressor according to claim 40, wherein the filter impulse constructor is adapted to providing the real-valued value based on the complex-valued input filter response value as the corresponding compressed impulse response value of the compressed filter impulse response, when the filter impulse response value comprises a higher value.

45. The filter compressor according to claim 1, wherein the filter compressor is adapted to generating a plurality of sets of compressed filter impulse responses based on a plurality of sets of input filter impulse responses, each compressed filter impulse response of one set of compressed filter impulse responses corresponds to exactly one center frequency of a plurality of center frequencies, to each center frequency of the plurality of center frequency corresponds exactly one compressed filter impulse response of each set of the plurality of the sets of compressed filter impulse responses, each input filter impulse response of one set of input filter impulse responses corresponds to exactly one center frequency of the plurality of center frequencies, to each center frequency of the plurality of center frequencies corresponds exactly one input filter impulse response of each set of the plurality of sets of input filter impulse responses.

46. The filter compressor according to claim 45, wherein the processor is adapted to examining the filter impulse response values from at least two input subband filter impulse responses of at least one set of the plurality of sets of input filter impulse responses, and wherein the processor is furthermore adapted to finding filter impulse response values comprising the higher values from at least two sets of input filter impulse responses corresponding to the same center frequency.

47. The filter compressor according to claim 46, wherein the processor is adapted to finding filter impulse response values comprising the higher values from all sets of input filter impulse responses corresponding to the same center frequency.

48. The filter compressor according to claim 46, wherein the processor is adapted to finding filter impulse response values comprising the higher values of at least two sets of input filter impulse responses of the plurality of sets of input filter impulse responses corresponding to a same sample or time index n, wherein n is an integer.

49. The filter compressor according to claim 45, wherein the processor is adapted to calculating an evaluation representation $A^v(n,k)$ or a whitened evaluation representation $A_W^v(n,k)$ for each set of input filter impulse responses, wherein v is an integer indicating the sets of input filter impulse responses, wherein n is an integer indicating a sample or time index, wherein k is an integer indicating an index of the subbands, and wherein the processor is further adapted to calculating the evaluation representation $A(n,k)$ based on at least two evaluation representations $A^v(n,k)$ or based on at least two whitened evaluation representations $A_W^v(n,k)$.

50. The filter compressor according to claim 49, wherein the processor is adapted to calculating the evaluation representation $A(n,k)$ based on one of the equations $$A(n,k) = \sum_{v=0}^{N-1} A^v(n,k) \text{ and } A(n,k) = \sum_{v=0}^{N-1} A_W^v(n,k),$$

wherein N is an integer indicating the number of sets of input filter impulse responses.

51. The filter compressor according to claim 45, wherein the filter impulse response constructor is adapted to constructing the compressed subband filter impulse responses of the plurality of sets of compressed filter impulse responses such that the filter impulse response values of the compressed filter impulse responses corresponding to the same center frequencies and the same sample or time index are set to zero, not comprised in the compressed filter impulse responses of the plurality of sets of compressed filter impulse responses or replaced by a respective real-valued value, when the corresponding filter impulse response values are complex-valued.

52. A method for manufacturing compressed subband filter impulse responses from input subband filter impulse responses corresponding to the subbands, which comprise filter impulse response values at filter taps, comprising:
   examining the filter impulse response values from at least two input subband filter impulse responses to find filter impulse response values comprising higher values and at least one filter impulse response value comprising a value being lower than the higher values; and
   constructing the compressed subband filter impulse responses using the filter impulse response values comprising the higher values,
   wherein the compressed subband filter impulse responses
      do not comprise filter impulse response values corresponding to filter taps of the at least one filter impulse response value comprising the lower value; or
      comprise zero-valued filter impulse response values corresponding to filter taps of the at least one filter impulse response value comprising the lower value.

53. A non-transitory storage medium having stored thereon a computer program for performing, when running on a processor, a method for manufacturing compressed subband filter impulse responses from input subband filter impulse responses corresponding to the subbands, which comprise filter impulse response values at filter taps, comprising:
   examining the filter impulse response values from at least two input subband filter impulse responses to find filter impulse response values comprising higher values and at least one filter impulse response value comprising a value being lower than the higher values; and
   constructing the compressed subband filter impulse responses using the filter impulse response values comprising the higher values,
   wherein the compressed subband filter impulse responses
      do not comprise filter impulse response values corresponding to filter taps of the at least one filter impulse response value comprising the lower value; or
      comprise zero-valued filter impulse response values corresponding to filter taps of the at least one filter impulse response value comprising the lower value.

54. A non-transitory computer-readable storage medium comprising stored thereon a plurality of sets of subband filter impulse responses, each set of subband filter impulse responses together approximating a time-domain head related transfer function-related filter, wherein a filter impulse response of each of the time-domain head related transfer function-related filters is larger than the sum of the lengths of the subband filter impulse responses of the respective set of subband filter impulse responses, or wherein a filter impulse response of each of the time-domain head related transfer function-related filters is larger than the sum of the lengths of the complex-valued filter impulse response values of the subband filter impulse responses of the respective set of subband filter impulse responses, when the filter impulse response values are complex-valued.

55. The non-transitory computer-readable storage medium according to claim 54, wherein the plurality of sets of subband filter impulse responses comprises a common data pattern.

56. The non-transitory computer-readable storage medium according to claim 55, wherein the common data pattern relates to zero-valued or missing filter impulse response values of subband filter impulse responses of at least two sets of subband filter impulse responses or real-valued values, when the filter impulse response values are complex-valued.

57. The non-transitory computer-readable storage medium according to claim 54, wherein at least one set of subband filter impulse responses together approximates a spatial audio filter.

\* \* \* \* \*